US012805211B2

(12) United States Patent
Feuillet et al.

(10) Patent No.: US 12,805,211 B2
(45) Date of Patent: Nov. 17, 2026

(54) METHOD FOR PRODUCING III-N MATERIAL-BASED VERTICAL COMPONENTS

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

(72) Inventors: Guy Feuillet, Grenoble Cedex (FR); Thierry Bouchet, Grenoble Cedex (FR); Matthew Charles, Grenoble Cedex (FR); Roy Dagher, Nice (FR); Jesus Zuniga Perez, Biot (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 631 days.

(21) Appl. No.: 18/258,784

(22) PCT Filed: Dec. 22, 2021

(86) PCT No.: PCT/EP2021/087197
§ 371 (c)(1),
(2) Date: Jun. 21, 2023

(87) PCT Pub. No.: WO2022/136500
PCT Pub. Date: Jun. 30, 2022

(65) Prior Publication Data
US 2024/0047201 A1 Feb. 8, 2024

(30) Foreign Application Priority Data
Dec. 22, 2020 (FR) ..................................... 20 13964

(51) Int. Cl.
*H10P 14/20* (2026.01)
*H10D 8/01* (2025.01)
(Continued)

(52) U.S. Cl.
CPC ......... *H10P 14/3251* (2026.01); *H10D 8/043* (2025.01); *H10D 8/051* (2025.01);
(Continued)

(58) Field of Classification Search
CPC ......... H01L 21/02513; H01L 21/02647; H01L 21/0265; H01L 21/02458; H01L 21/0254;
(Continued)

(56) References Cited

U.S. PATENT DOCUMENTS 6,261,929 B1 * 7/2001 Gehrke ............... H10P 14/2901 257/E21.123
2003/0030068 A1 2/2003 Hata et al.
(Continued)

FOREIGN PATENT DOCUMENTS

WO WO-2019122461 A1 * 6/2019 ........... C30B 25/183

OTHER PUBLICATIONS

Shibata et al., "1.7 kV / 1.0 mΩcm$^2$ Normally-off Vertical GaN Transistor on GaN substrate with Regrown p-GaN/AlGaN/GaN Semipolar Gate Structure", IEEE International Electron Devices Meeting (IEDM), IEEE, 2016, pp. 10.1.1-10.1.4 (4 pages).
(Continued)

*Primary Examiner* — Julio J Maldonado
*Assistant Examiner* — Nathan Pridemore
(74) *Attorney, Agent, or Firm* — Oblon, McClelland, Maier & Neustadt, L.L.P.

(57) ABSTRACT

A method for producing a vertical component comprising with the basis of a III-N material, comprising providing platelets made of the III-N material obtained by epitaxy on pads, the platelets comprise at least first and second layers
(Continued)

doped and stacked on one another in a vertical direction. The method further includes the production of a first electrode and the production of a second electrode located on the platelet and configured such that a current passing from one electrode to the other passes through at least the second layer in all of its thickness, the thickness being taken in the vertical direction.

19 Claims, 18 Drawing Sheets

(51) Int. Cl.

| | |
|---|---|
| ***H10D 8/50*** | (2025.01) |
| ***H10D 8/60*** | (2025.01) |
| ***H10D 30/01*** | (2025.01) |
| ***H10D 30/63*** | (2025.01) |
| ***H10D 84/00*** | (2025.01) |
| ***H10D 84/05*** | (2025.01) |
| ***H10D 84/82*** | (2025.01) |
| ***H10P 95/00*** | (2026.01) |

(52) U.S. Cl.
CPC ................. *H10D 8/50* (2025.01); *H10D 8/60* (2025.01); *H10D 30/021* (2025.01); *H10D 30/63* (2025.01); *H10D 84/05* (2025.01); *H10D 84/221* (2025.01); *H10D 84/82* (2025.01); *H10P 14/2905* (2026.01); *H10P 14/3208* (2026.01); *H10P 14/3211* (2026.01); *H10P 14/3216* (2026.01); *H10P 14/3238* (2026.01); *H10P 14/3256* (2026.01); *H10P 14/3416* (2026.01); *H10P 95/11* (2026.01)

(58) Field of Classification Search
CPC .... H10D 84/05; H10D 62/8503; H10D 8/051; H10D 8/50; H10D 8/60; H10D 30/63; H10D 84/221; H10D 84/82; H10D 30/0291; H10D 30/66; H10D 8/043; H10D 30/021; H10D 8/05; H10D 30/0297; H10D 30/668; H10P 14/3248; H10P 14/3251; H10P 14/3216; H10P 14/2908; H10P 14/3416; H10P 14/3802; H10P 95/11; H10P 14/276; H10P 14/278; H10P 14/2905; H10P 14/3208; H10P 14/3211; H10P 14/3238; H10P 14/3256; H10P 14/271; H10P 14/3451
See application file for complete search history.

(56) References Cited

U.S. PATENT DOCUMENTS

| | | | | |
|---|---|---|---|---|
| 2012/0007143 | A1 | 1/2012 | Kim et al. | |
| 2014/0141592 | A1* | 5/2014 | Irsigler | C30B 25/183 438/424 |
| 2021/0134962 | A1* | 5/2021 | Kimura | H10D 62/8503 |
| 2021/0164126 | A1 | 6/2021 | Feuillet et al. | |
| 2025/0118552 | A1* | 4/2025 | Charles | H01L 21/0254 |

OTHER PUBLICATIONS

Sun et al., "High-Performance GaN Vertical Fin Power Transistors on Bulk GaN Substrates", IEEE Electron Device Letters, vol. 38, No. 4, Apr. 2017, pp. 509-512.
International Search Report & Written Opinion issued Apr. 21, 2022 in PCT/EP2021/087197 , filed on Dec. 22, 2021, 8 pages.
Gupta et al., OG-FET: An In-Situ Oxide, G aN Interlayer-Based Vertical Trench Mosfet, *IEEE Electron Device Letters*, 2016, vol. 37, No. 12, 4 pages.
Li et al., "600 V/ 1.7 ΩNormally-Off GaN Vertical Trench Metal-Oxide-Semiconductor Field-Effect Transistor", *IEEE Electron Device Letters*, 2016, vol. 37, No. 11, p. 1466-1469.
Oka et al., "1.8 mΩcm2 vertical GaN-based trench metal-oxide-semiconductor field-effect transistors on a free-standing GaN substrate for 1.2-kV-class operation", *Applied Physics Express*, 2015, vol. 8, No. 5, 4 pages.

* cited by examiner

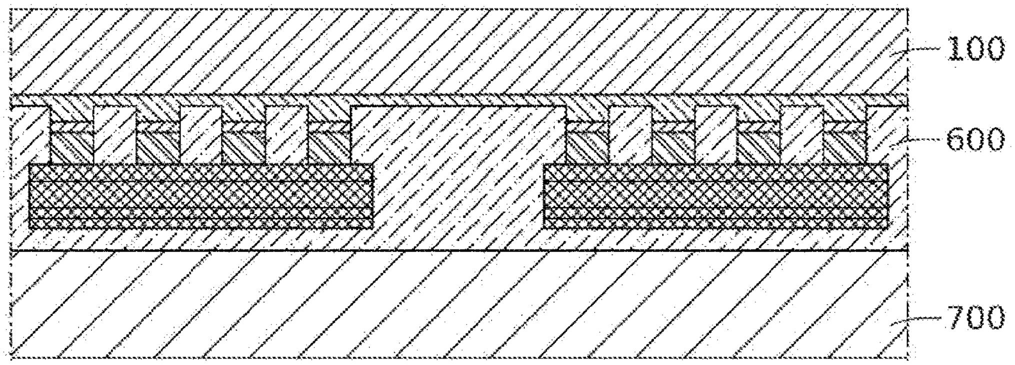
FIG. 3C
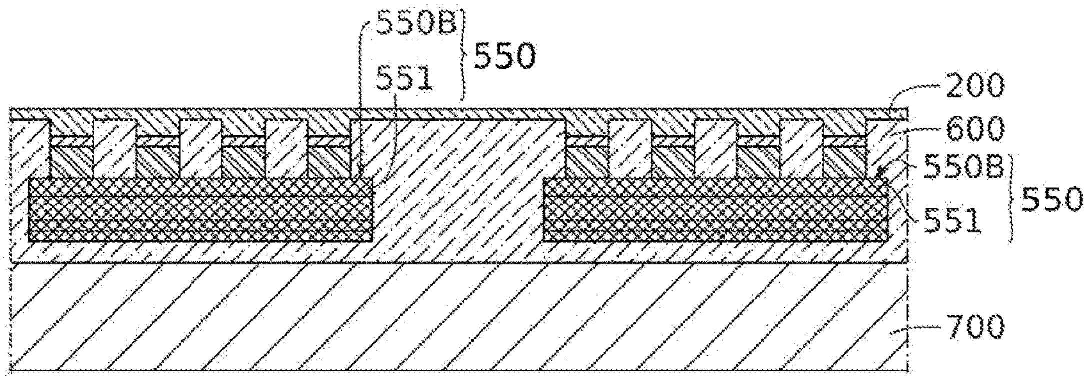
FIG. 3D1
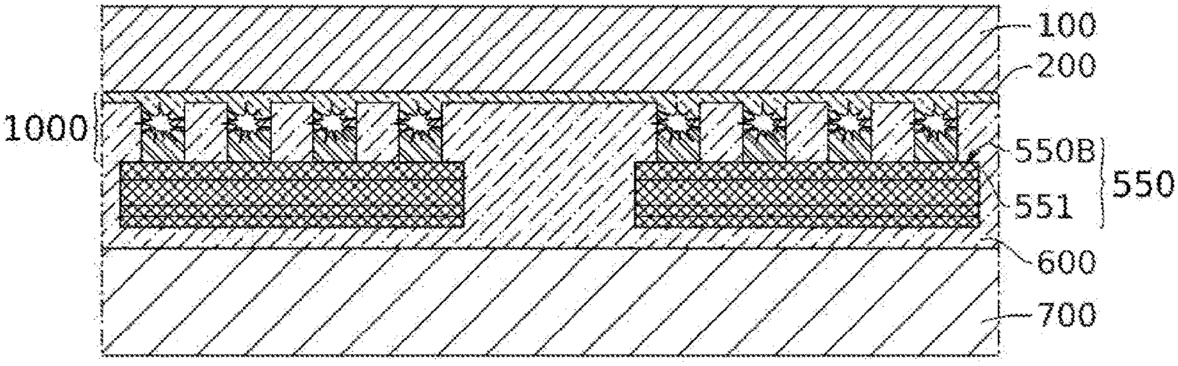
FIG. 3D2

METHOD FOR PRODUCING III-N MATERIAL-BASED VERTICAL COMPONENTS

TECHNICAL FIELD OF THE INVENTION

The invention relates to the production of so-called vertical microelectronic devices, with the basis of a III-N material. The invention has application, for example, in the field of vertical power components, such as power transistors, or power diodes.

For numerous microelectronic or optoelectronic applications, it is sought to produce components, wherein a nitride layer with the basis of a III-N material, for example a gallium nitride (GaN) layer, has electrodes on two opposite faces.

STATE OF THE ART

An example of power components is illustrated in FIG. 1. In this figure, the power component is a MOS (metal-oxide-semiconductor) transistor. A layer 550 of a III-N material forms a stack of layers having different dopings. This can, for example, be a stack of layers 554, 553, 552, 551 having the following n+/p−/n−/n+ dopings and successively disposed from the first face 550A (also called front face) and to a second face 550B (also called rear face) of the III-N material. Electrodes 10, 30 are located on the front face 550A and an electrode 20 is located on the rear face 550B of the III-N layer 550. In this example, the electrodes 10, 30 correspond respectively to the source and the gate of the transistor, the electrode 20 corresponding to the drain. The electrodes being located on two opposite faces 550, 550 of the material 550, the current circulates vertically in the whole volume of the material and the withstand blocking of the component is correlated to the thickness of this material.

Disposing a vertical component made of III-N material such as GaN makes it possible to increase the power density and the withstand voltage of the components (typically 900V to 5 kV) with respect to a lateral GaN component or a vertical silicon component. Thus, when made of vertical GaN, it is sufficient to have a thickness of 8 μm of GaN doped at $2\times10^{16}$ $cm^{-3}$ to withstand a voltage of 1200V when a thickness of 100 μm of silicon doped at $1.3\times10^{14}$ $cm^{-3}$ is necessary for a vertical component of the same structure. GaN is a large gap material fully adapted for power components. This material thus provides considerable advantages for vertical components of the p-i-n diode, Schottky diode type, and for transistors of the:

- MOSFET type (Metal Oxide Semiconductor Field Effect Transistor). A GaN-based vertical MOSFET transistor architecture is, for example, described in the following publications: Ch. Gupta et al. IEEE EDL (2016) 37 p1601, Ray Li et al. IEEE EDL (2016) 37 p1466, Tohru Oka et al. APEX (2015) 8 p054101.
- FinFET type (Fin Field Effect Transistor). A GaN-based vertical MOSFET transistor architecture is, for example, described in the following publications: Min Sun et al. IEEE EDL (2017) 48, p509.
- CAVET type (Current Apertured Vertical Electron Transistor). A GaN-based vertical MOSFET transistor architecture is, for example, described in the following publications: Daisuke Shibata et al. IEDM (2016).

To produce a vertical component made of III-N materials which is efficient, it is necessary that the layer 550 made of III-N material has intrinsic quality features (resistivity, impurity, number of defects) in its whole thickness.

To form a silicon (Si) layer, numerous well-understood and inexpensive technologies are available. For example, a floating molten zone growth can be favoured (usually called FZ growth) which is purer and which is therefore more adapted to high voltages than a Czochralski (CZ) pulling growth.

However, forming a material layer 550 made of III-N material, for example, made of gallium nitride (GaN), has proven to be more complex if it is sought to reach reduced defect levels.

The usual growth of GaN-based structures on an Si or SiC substrate (silicon carbide) is feasible, but induces densities of dislocations which are far too high for the application to the vertical power transistor.

The other option consists of performing epitaxy of the structure on GaN pseudo-substrates (usually called template or freestanding). These GaN pseudo-substrates are available in four-chip formats. These GaN substrates are also very expensive and available only in very small size formats, typically two-chip.

There is therefore a need consisting of proposing a solution for producing vertical components with the basis of a III-N material, which does not have the disadvantages of known solutions. Such as in aim of the present invention.

Another aim of the present invention consists of proposing a solution for producing this type of component with a cost price which remains limited and in formats which are compatible with industrial productivity constraints.

Other aims, features and advantages of the present invention will appear upon examining the following description and the accompanying drawings. It is understood that other advantages can be incorporated.

SUMMARY OF THE INVENTION

To achieve this aim, according to an embodiment of the present invention, a method for producing a so-called vertical microelectronic component is provided, comprising at least one layer with the basis of a III-N material, the method comprising the following successive steps:

- providing a stack comprising a plurality of pads extending from a base substrate, the pads being distributed over the base substrate, so as to form several pad assemblies, at least some of the pads of the assembly comprising at least:
  - a top intended to form a germination layer, a crystalline section,
  - A creeping section, formed of a material having a vitreous transition temperature $T_{vitreous\ transition}$, the crystalline section surmounting the creeping section,
- epitaxially growing a crystallite made of III-N material on at least some of the tops of said pads and continuing the epitaxial growth of the crystallites until coalescence of the crystallites carried by the adjacent pads of one same assembly, so as to form, a platelet made of III-N material on each assembly,
- interrupting the epitaxial growth of the crystallite before crystallites belonging to two distinct assemblies coalesce, such that the platelets of each assembly are distant from one another.

The method comprises at least one step of doping the III-N material of the platelets such that least some of the platelets comprise at least:

- one first layer with the basis of the III-N material and which has a first doping taken from among the n+, n− and p doping types, one second layer with the basis of the III-N material and which has a second doping taken from among the n+, n− and p doping types.

The types of the first and second dopings are different. The first and second layers are stacked in the platelet, in a so-called vertical direction, between a first face to and a second face of the platelet.

The method further comprises at least the production of a first electrode and the production of a second electrode located on the platelet and configured, such that a current passing from one electrode to the other passes through at least the second layer in its whole thickness $e_{552}$, the thickness $e_{552}$ being taken in said vertical direction.

Thus, the method proposed provides the production of platelets of III-N material (GaN, for example) from assemblies of pads etched in a stack and comprising a crystalline layer intended for the epitaxy of the III-N material and a creeping layer. During their epitaxial growth, the crystallites formed at the top of the pads of one same pad assembly are joined to form a platelet, each of the platelets being intended to form the layer of III-N material of a vertical component.

As will be indicated in more detail below, the use of these pad arrays makes it possible to epitaxially form platelets of III-N material, without or with few dislocations. Indeed, the use of pad assemblies makes it possible to take advantage of the creeping properties of certain materials of the pads at the epitaxial temperature, in order to align the crystallites of III-N material which grow by pendeo-epitaxy from adjacent pads until forming the platelets, this without forming coalescence defects.

More specifically, during epitaxy, the portion of the pad which is formed by the creeping section reaches (or exceeds) its vitreous transition temperature or a temperature very close to the latter. Under the effort of a mechanical stress, this pad portion can thus be deformed. Thus, when two crystallites which are supported by one same pad assembly come into contact and coalesce, the mechanical stresses generated by this contact are transferred to the pads, and therefore to the creeping sections. The latter are deformed, absorbing, due to this, some, even all of the mechanical stresses. The appearance and the propagation of dislocations at the coalescence boundaries between the crystallites which form a platelet of III-N material can thus be considerably reduced, even avoided.

In particular, if the crystallites are disoriented against one another in the plane, wherein the substrate mainly extends (“twist”) or outside of the plane (“tilt”), the disorientation between crystallites results in the creation of a coalescence grain boundary. This grain boundary has lots of energy since it results from the superposition of defect stress fields which compose it. If the crystallites push on pads which can be deformed as the method described enables, the adjacent crystallites are thus oriented in the plane or outside of the plane to minimise the total energy of the system, without there being a formation of grain boundaries. On the contrary, if the crystallites push on pads which cannot be deformed, there is a formation of grain boundaries and therefore an appearance of dislocations.

Thus, the method described proposes a solution clearly opposite to all the solutions of the state of the art, which provide to delimit by etching, platelets from an initial common layer obtained by epitaxy. The method proposed makes it possible to pass totally from one etching step to delimit the platelets.

Thus, the invention relates to a new epitaxial structure growth and to the direct production by an associated “bottom-up” method (i.e. from the bottom to the top) of GaN power vertical components.

By using the solutions of the technique usually used to produce vertical components, for example vertical MOSFET transistors, the method commonly used consists of performing epitaxy of the n−/p/n+ structure on a GaN solid plate substrate. This epitaxy is then etched to design the periodic source structure on the surface. This is therefore a “top-down” method (i.e. from the top to the bottom). The drain is taken on the rear face of the GaN substrate. The gates are located in the etched parts. The depletion in the p-GaN, is done at the surfaces which have been etched.

It has proved to be, that with this solution of the state of the art, etching generates surface and subsurface defects which greatly impact the transport of charge carriers through this zone on the subsurface. Generally, the so-called dry etching techniques generate problems. Their damaging effects are of several orders: roughening of the surface, chemical contamination linked to the chemistry of the gases used, levels associated with the nitrogen vacancies, etc. For example, the p (Mg)-doped GaN surfaces are impacted by ICP etching (inductive coupling plasma etching), which induces a very clear reduction in the concentration of acceptors in the zones close to the surface.

It has also been shown that RIE (reactive ion etching) or ICP etching induces trap levels in the gap of the GaN. The oxygen concentration is also increased, typically by a factor of 3, in the zone impacted by the dry etching, probably due to the oxidation of the surface layers, correlatively to the appearance of a nitrogen sub-stoichiometry. In addition, the images taken by transmission electron microscopy (TEM) seems to reveal that the surface zone has become amorphous over a few nm.

Certainly a suitable post-etching chemical treatment would make it possible to reduce the negative effects of etching. However, the SIMS (secondary ion mass spectrometry) analysis shows that the removal of impurities on the surface induced by etching is not total with the post-etching chemical treatment.

The effects of RIE etching have also been studied to determine if it was possible to restart contacts on etched surfaces. For the contact n, literature seems to agree in saying that RIE etching does not seem to have a damaging impact, doubtlessly due to the creation of nitrogen vacancies. However, for the contact p, the situation is opposite since it seems impossible to obtain a contact p with a resistance which is compatible with the applications concerned by these vertical components. Annealings of the RTA (rapid thermal annealing) type make it possible to improve the contact without reobtaining Ohmic contacts.

To overcome these problems, it is possible to implement methods for passivating etching flanks. These consist of depositing a layer of the $SiO_2$ type on the etching flanks to avoid any non-radiative recombination on the mesa edges delimited by etching. Further, that this should be associated with a preliminary chemical treatment to remove—but only partially—the defect zone, this adds an additional technological step which is difficult to control. In the case of vertical structures made of GaN of the MOSFET type, this passivation could be directly achieved by the gate oxide itself, but, as indicated above, this does not remove the residual defects linked to etching.

Therefore, it has proved to be that these problems linked to dry etching are only partially resolved by chemical or thermal treatment methods or by deposition of passivating layers.

In this context, the claimed method proposes a solution which is radically far away from known solutions, since this claimed method makes it possible to be passed totally from this etching step which is disadvantageous for the vertical structure charge transport properties.

Moreover, conventional solutions for mitigating, without removing them, the disadvantages of this etching considerably complexify the methods and induce other disadvantages. The solution proposed in the scope of the present invention relates to a simple and easily reproducible method, which makes it possible to obtain platelets of III-N materials which have not been altered by etching methods and which do not have or have very few defects linked to the coalescence boundaries. The invention thus makes it possible to considerably increase the effectiveness of the vertical components obtained from these III-N material-based platelets.

This solution thus makes it possible to improve the performances of these vertical components. Indeed, it makes it possible to obtain vertical components of a very small surface area, while having high thicknesses. Indeed, the thickness of the stack of layers made of III-N material can easily be greater than 8 μm, even 10 μm, even 12 μm without having dislocations. The density of dislocations in these GaN platelets is less than 1 to $2.1^{E}8/\text{cm}^2$. Advantageously, densities less than $1^{E}8/\text{cm}^2$ even less than $1^{E}7/\text{cm}^2$ ($10^7/\text{cm}^2$) can be reached. The surface area of the platelets is determined by the pad array.

The precision of the methods implemented to produce the pad array, will partially determine at least the small dimension possible for vertical components and therefore the density of these components in a circuit. For example, for pad arrays developed by nanoimprint and by e-beam lithography, pad sizes of 50 nm and periods of 150 to 200 nm can be reached. It is thus possible to obtain platelet sizes of around 20 μm, for example.

Moreover, this method makes it possible to directly produce vertical components, each having a size corresponding to the initial size of the platelet.

The method proposes thus makes it possible to obtain platelets having a reduced dislocation rate, increased thicknesses and small surface areas. This method is therefore particularly advantageous to produce power components with improved performance.

The present invention thus has a particular advantage for vertical power components. Particular examples will be described in detail below. For example, the following components can be mentioned: power transistors, Schottky diode, p-i-n diode. Nevertheless, the invention covers plenty of other microelectronic devices and components. By the term "microelectronic devices or components", this means any type of device produced with microelectronic means. These devices, in particular, include in addition to devices with a purely electronic purpose, micromechanical or electromechanical devices (MEMS, NEMS, etc.) as well as optical or optoelectronic devices (MOEMS, etc.). This can be a device intended to ensure an electronic, optical, mechanical function, etc. This can also be an intermediate product, only intended for the production of another microelectronic device.

As a non-limiting example, the method proposed makes it possible to produce the following vertical transistors: MOSFET, FinFET, CAVET, HEMT (High Electron Mobility Transistor").

BRIEF DESCRIPTION OF THE FIGURES

The aims, objectives, as well as the features and advantages of the invention will best emerge from the detailed description of an embodiment of the latter which is illustrated by the following accompanying drawings, wherein:

FIGS. 3A to 3J illustrate steps which could be implemented in the scope of the method according to the present invention to obtain a non-limiting example of a vertical component. The steps of FIGS. 3A to 3J can be implemented after the step of FIG. 2F.

Figure 1:
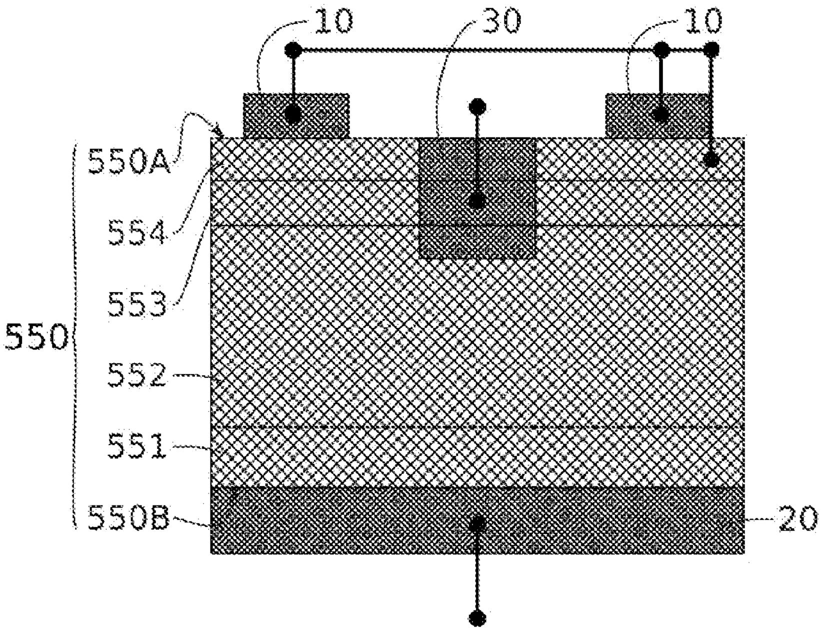
FIG. 1 schematically illustrates an example of a vertical component, in this case a MOSFET transistor, with the basis of a III-N material.

The figures are given as examples and are not limiting of the invention. They are principle schematic representations intended to facilitate the understanding of the invention and are not therefore necessarily to the same scale as practical applications. In particular, the relative thicknesses of the different layers, sections, crystallites and platelets are not representative of reality.

DETAILED DESCRIPTION OF THE INVENTION

Before starting a detailed review of embodiments of the invention, optional features are stated below, which can optionally be used in association or alternatively:

According to an example, the first layer has a thickness $e_{551}$ of between 1 and 5 μm ($10^{-6}$ metres), preferably of between 1 and 3 μm, preferably around 2 μm. According to an example, the first layer extends from one flank to the other of the platelet. The first layer extends over the whole surface of the platelet. The surface of the platelet is projected over a parallel plane (plane xy), wherein the upper face of the substrate mainly extends.

According to an example, the first layer has a doping level greater than or equal to $5.10^{17}$ atoms per cubic centimetre (at/$cm^3$). The first layer has a doping level, preferably of around $5.10^{18}$ at/$cm^3$.

According to an example, the first layer has an n+ type doping. This makes it possible to ensure a good quality electrical conduction with the second electrode.

According to an example, the second layer extends from one flank to the other of the platelet. The second layer extends over the whole surface of the platelet. The surface of the platelet is projected over a parallel plane (plane xy), wherein the upper face of the substrate mainly extends.

According to an example, the second layer has a thickness $e_{552}$ of at least 8 μm ($10^{-6}$ metres) and preferably of at least 10 μm.

According to an example, the second layer has a doping level greater than or equal to $1.10^{15}$ at/$cm^3$. The second layer has a doping level, preferably of around $1.10^{16}$ at/$cm^3$. According to an example, the second layer has an n− type doping.

According to an example, the step of doping the III-N material of the platelets is carried out during the formation step, on each assembly, of a platelet by epitaxial growth.

According to an example, the electrodes are configured such that a current passing from one electrode to the other also passes through the first layer in all of its thickness. According to an example, the first and second layers are located between the first electrode and the second electrode. Thus, one from among the first and the to second electrodes is located on the first face of the platelet and the other, from among the first and the second electrodes is located on the second face of the platelet. This makes it possible that the current passing from one electrode to the other passes through the whole thickness of the first and second layers, which considerably improves the performance of the device.

According to an example, one from among the first and the second electrodes is located on the first face of the platelet, and the other from among the first and the second electrodes extends, in the vertical direction, from the first face and to the first layer by passing through the second layer.

According to an example, the platelets only comprise the following layers: said first layer and said second layer, the component preferably forming a Schottky-type diode.

According to an example, the platelets comprise the following layers: said first layer, said second layer, and a third layer surmounting the second layer and preferably having a p type doping, positioned such that the second layer is located between the first and third layers, the component preferably forming a p-i-n type diode or a transistor.

According to an example, the third layer has a thickness of at least 100 nm ($10^{-9}$ metres) and preferably of less than 1 μm. Preferably, the thickness is of between 300 and 700 nm.

According to an example, the third layer has a chemical doping level greater than or equal to $5.10^{17}$ at/$cm^3$.

According to an example, the third layer has a doping level, preferably of around $1.10^{18}$ at/$cm^3$.

According to an example, the third layer has a p type doping.

According to an example, the platelets only comprise the following layers: said first layer, said second layer, and said third layer, the component preferably forming a p-i-n type diode.

According to an example, the platelets comprise the following layers: said first layer, said second layer, said third layer, as well as at least one fourth layer surmounting the third layer and preferably having an n+ type doping, the component preferably forming a transistor.

According to an example, the first electrode forms a source for the transistors, the second electrode forms a drain for the transistors.

According to an example, the method also comprises a step of producing a gate for the transistor.

According to an example, the fourth layer 554 has a thickness of at least 50 nm. Preferably, the thickness of the fourth layer is between 50 and 200 nm, and preferably around 100 nm.

According to an example, the fourth layer has a doping level greater than or equal to $5.10^{17}$ at/$cm^3$. According to an example, the fourth layer has a doping level, preferably around $5.10^{18}$ at/$cm^3$. According to an example, the second layer has an n+ type doping. This makes it possible to ensure a good quality electrical conduction with the first electrode. The fourth layer forms an Ohmic contact with the first layer.

According to an example, during the growth of the third layer, a first lateral portion epitaxially grows on flanks of the second layer. During the growth of the fourth layer, a second lateral portion epitaxially grows on the flanks of the second layer and on the first lateral portion. The growth and the doping level of the third layer and of the fourth layer are controlled, such that the first and second lateral portions form an electrically insulating barrier. This electrically insulating barrier is obtained by depletion, i.e. that they no longer comprise or only comprise very few free carriers. They thus form depleted layers.

According to an example, the method comprises at least one pad removal step.

According to an example, the at least one pad removal step is carried out before the production of the first electrode and before the production of the second electrode.

According to an example, the at least one pad removal step is carried out after the production of the first electrode and before the production of the second electrode.

According to another embodiment, the pads are preserved after the production of the first electrode and after the production of the second electrode.

According to an example, the method comprises, after the production of a platelet on each pad assembly, the second face being rotated facing the pads:

- Fixing a handling substrate on the stack, such that the platelets and the pads are located between the base substrate and the handling substrate,
- Removing the base substrate,
- Making the second face of the platelets accessible, which comprises the removal of pads,
- Forming the second electrode on the second face, the second electrode preferably being a conductive substrate mounted on the second face,
- Making at least some of the first face of the platelets accessible,
- Forming the first electrode on the first face.

According to an example, the method comprises, before the fixing of a handling substrate, the production of an encapsulation layer encapsulating the platelets and covering the first face.

According to an example, the method comprises, after the removal of pads, the production of an encapsulation layer encapsulating the platelets and covering the first face, the first electrode being formed through the encapsulation layer.

According to an example, making at least some of the first face of the platelets accessible, comprising completely stripping the first face of the platelets.

According to an example, the first electrode is formed so as to not cover a central zone 1 of the first face, for example intended to receive an electrode forming a transistor gate, and to extend over a peripheral zone surrounding the central zone 1.

According to an example, making at least some of the first face of the platelets accessible, comprising removing some of the encapsulation layer so as to create in the encapsulation layer, an opening making only some of the first face of the platelets accessible, the first electrode being formed through said opening.

According to an example, the method comprises, after the production of a platelet on each pad assembly, the second face B being rotated facing the pads:

Producing at least one opening for each platelet through the base substrate and the pads so as to make at least some of the second face of the platelets accessible, optionally by preserving certain pads, Forming the second electrode on the second face, through said opening.

Before or after the production of the at least one opening, forming the first electrode on the first face.

According to an example, the method comprises, after the production of a platelet on each pad assembly, the second face B being rotated facing the pads:

Producing at least one hole for each platelet, the hole extending from the first face and at least to the first layer, Forming the second electrode by filling the hole with an electrically conductive material, Forming the first electrode on the first face.

According to an example, the epitaxial growth is carried out at a temperature $T_{epitaxy}$, such that:

$$T_{epitaxy} \geq k1 \times T_{vitreous\ transition}, \text{ with } k1 \geq 0.8.$$

According to an example, the III-N material is a nitride of at least one from among gallium (Ga), indium (In) and aluminium (Al).

According to an example, the III-N material is GaN-based, preferably the III-N material is GaN.

According to an example, each of these III-N material layers has a lower face and an upper face, substantially parallel to an upper face of the substrate. Each layer forms a platelet. All the lower faces of the layers are substantially comprised in one same plane. The same applies for the upper faces.

According to an example, the creeping layer is made of a viscous material. It has a viscoplastic transition. Preferably, this material is taken from among:

a silicon oxide SixOy, x and y being integers, and preferably the creeping layer is made of $SiO_2$, a glass, a glass made of borosilicate, a glass made of borophosphosilicate (BPSG).

According to an example, the epitaxial growth being carried out at a temperature $T_{epitaxy}$, such that: $T_{epitaxy} \geq k1 \times T_{vitreous\ transition}$, with $k1 \geq 0.8$.

Optionally, the epitaxial growth is carried out at a temperature $T_{epitaxy}$, such that: $T_{epitaxy} \geq k1 \times T_{vitreous\ transition}$, with $k1 \geq 0.8$.

According to an example, k1=1, and preferably k1=1.5. According to an example of an embodiment, k1=0.87 or k1=0.9. According to a particularly advantageous example, k1=0.92. Thus, in the case where the creeping sections are formed of $SiO_2$, $T_{epitaxy} \geq 1104°$ C., $T_{vitreous\ transition}$ for $SiO_2$ equal to 1200° C. According to an example of an even more preferable embodiment, k1=0.95. According to an example of an even more preferable embodiment, k1=1, and preferably k1=1.5.

According to an example, $T_{epitaxy} \leq k2 \times T_{min\ melting}$, $T_{min\ melting}$ being the lowest melting temperature from among the melting temperatures of the sections forming the pad, with $k2 \leq 0.9$ and preferably $k2 \leq 0.8$. According to an example of an embodiment, k2=0.9. This makes it possible to avoid a diffusion of the species of the material, the melting temperature of which is the lowest. Thus, in the case where the pad is formed of $SiO_2$ creeping sections and of silicon crystalline sections, $T_{epitaxy} \leq 1296°$ C. Indeed, $T_{min\ melting}$ is equal to the melting temperature of silicon, since the melting temperature of silicon is equal to 1440° and the melting temperature of $SiO_2$ is equal to 1970° C. Preferably, k2=0.8.

Figure 2A:
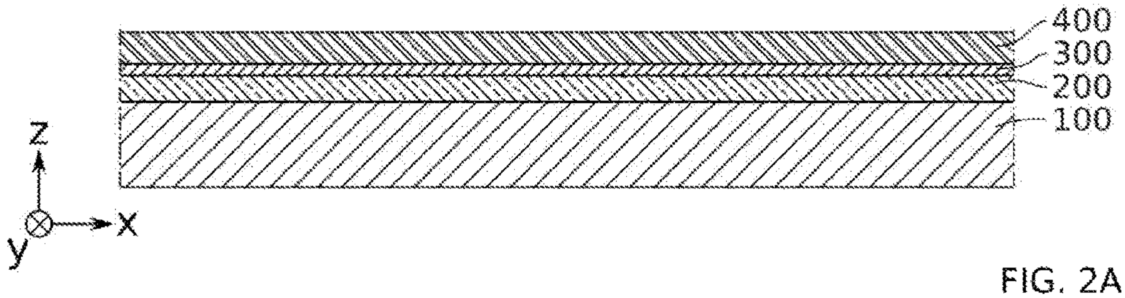
FIGS. 2A to 2F illustrate some of the steps of a non-limiting example of the method according to the present invention. At the end of these steps, platelets with the basis of a III-N material are obtained.
Figure 3A:
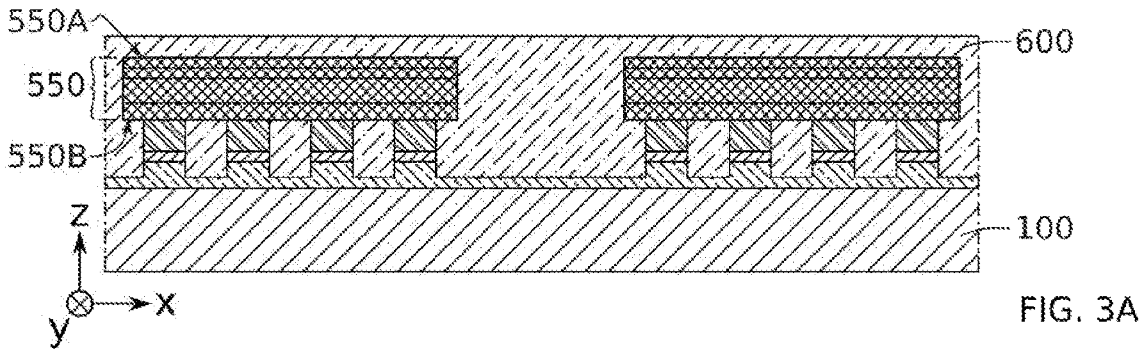

According to an example, the platelets have, projecting into a main extension plane parallel to the main faces of the platelets, i.e. parallel to an upper face of the substrate, i.e. parallel to the plane xy of the system xyz illustrated in FIGS. 2A and 3A, of the maximum dimensions of micrometric dimension. Preferably, these maximum dimensions are less than a few hundred micrometres. Preferably, these maximum dimensions are less than 500 μm and preferably less than 100 μm.

In the embodiment, wherein the pads are distributed over the substrate, so as to form a plurality of pad assemblies and that the epitaxial growth step is interrupted before crystallites belonging to two distinct assemblies coalesce, such that the layer formed on each assembly forms a platelet, the platelets being distant from one another, the method can have at least any one of the following features and steps which can be combined or taken separately:

According to an example, the distance D (D1 or D2) separating two adjacent pads of one same assembly, for example the tops of these two pads, is less than the distance W1 separating two adjacent pads belonging to two different assemblies. W1>D and preferably $W1 \geq 2 \leq D$.

According to an example, $W1 \geq k4 \times D$, with k4=1.5, preferably k4=2. This makes it possible to have smaller size platelets and a significant integration density in the case of the production of transistors. Preferably, k4=5. W1 can be equal to 1.5 microns.

W2 being the distance separating two adjacent platelets (see W2 in FIG. 3D), it is necessary that W2 is non-zero such that the two adjacent platelets do not touch one another. Thus, W2>0. According to an example, $W1 \geq k5 \times W2$, with:

W1 is the distance separating two adjacent pads belonging to two distinct assemblies;

W2 is the distance separating two adjacent platelets, W2 being >0. Preferably, k5=1.2, preferably k5=1.5, preferably k5=2.

According to an example, each pad has a cross-section, the maximum dimension $d_{pad}$ of which is between 10 and 500 nm ($10^{-9}$ metres), the maximum dimension $d_{pad}$ being measured in a plane parallel to a plane (xy), wherein an upper face of the substrate mainly extends, preferably 20 nm$\leq d_{pad} \leq$200 nm and preferably 50 nm$\leq d_{pad} \leq$100 nm. $d_{pad}=d_R$ or $d_S$.

According to an example, each pad has a distinct continuous contour of the pad which itself is adjacent.

According to an example, each pad has a constant cross-section over all of its height $H_{pad}$. Thus, the top of the pad has a cross-section which is identical or substantially identical to its base.

According to an example, each platelet has a cross-section, the maximum dimension $d_{platelet}$ of which is between 0.5 and 20 μm ($10^{-6}$ metres), the maximum dimension $d_{platelet}$ being measured in a plane parallel to a plane (xy), wherein an upper face of the substrate mainly extends, preferably 0.8 μm≤$d_{platelet}$≤3 μm and preferably 1 μm≤$d_{platelet}$≤2 μm. The maximum dimension $d_{platelet}$ thus corresponds to the maximum dimension of a projection of the platelet into a plane parallel to the plane xy, wherein the upper face of the substrate mainly extends.

Alternatively, the pads of one same assembly are distributed over the non-periodic substrate. Optionally, but advantageously, the platelets are distributed over the substrate periodically.

According to an example, the pads comprise at least one buffer layer surmounting the crystalline section, and made of a material different from that of the nitride platelets. According to this example, the nitride platelets are made of gallium nitride (GaN) and the buffer layer is made of aluminium nitride (AlN). This makes it possible, to avoid the appearance of the phenomenon of melt-back etching, generated by very high reactivity between gallium and silicon.

According to an example, the buffer layer is formed by an epitaxial deposition above the crystalline section, before the step of forming pads by etching. Thus, the stack comprises, before the step of epitaxially growing nitride platelets, at least said buffer layer. The action of forming the plurality of pads by etching after the formation of the buffer layer above the crystalline layer, makes it possible to avoid that the buffer layer is not deposited between the pads, typically on the bottom of the creeping layer or is not deposited on the walls of the sections formed by the crystalline layer, which would have been the case if this step of forming the buffer layer had been carried out after etching of the stack to form the pads. Thus, the epitaxial growth of the nitride platelets from the creeping layer is avoided. Naturally, this advantage is observed when the growth of the nitride layer intended to form each platelet is carried out by selective epitaxy. This growth is indeed carried out on the material of the buffer layer, but is not carried out on the material of the creeping sections. Such is the case when the latter are made of $SiO_2$, the buffer layer is made of AlN and the nitride platelet formed by epitaxy, for example according to an MOVPE technique (Metalorganic Vapour Phase Epitaxy), is GaN. Thus, the latter is not deposited at the foot of the pads.

According to an example, the pads comprise, before the step of epitaxially growing the nitride platelets, at least one primer layer, surmounting said buffer layer and made of gallium nitride (GaN).

According to an example, the stack comprises, before said step of forming pads by etching, at least one primer layer, surmounting the crystalline section, the primer layer being made of the same material as that of the nitride platelets. Thus, in an embodiment wherein the nitride platelets are made of GaN, the primer layer is also made of GaN. Advantageously, this primer layer makes it possible to facilitate the resumption of the epitaxial growth for the formation of crystallites. This feature is all the more advantageous than the surface area of the pads is small.

According to an example, each pad has an upper face and the epitaxial growth of the crystallites is carried out at least partially and preferably only from said upper face. Preferably, the buffer layer is disposed directly in contact with the upper face of the crystalline section or in contact with the upper face of the section formed by the primer layer.

If the top of the pad, i.e. the upper face of the uncovered pad, is formed by the crystalline section, then the crystallites are epitaxially grown directly in contact with the crystalline layer. If the top of the pad is formed by the primer layer, then the crystallites are epitaxially grown directly in contact with the damper layer. If the top of the pad is formed by the buffer layer, then the crystallites are epitaxially grown directly in contact with the buffer layer. Preferably, the damper layer is disposed directly in contact with the upper face of the crystalline section.

According to an example, at least one from among the buffer layer and the primer layer preserves a constant thickness during the epitaxial growth step.

According to an example, providing said stack comprises providing a developed substrate of the silicon-on-insulator (SOI) type comprising a base substrate surmounted successively on an oxide layer forming said creeping layer and a semiconductive layer forming said crystalline layer.

According to an example, the creeping section has a height $e_{220}$ such that $e_{220} \geq 0.1 \times d_{pad}$, $d_{pad}$ being the diameter of the pad, or more generally, the edge-to-edge distance of the pad taken, at the creeping section and in a direction parallel to a plane (xy) wherein an upper face of the substrate mainly extends, preferably $e_{220} \geq 1 \times d_{pad}$. These values, make it possible to obtain a sufficient deformation to reduce the stresses at the grain boundary.

According to an example, the pads have a height $H_{pad}$, and wherein two adjacent pads are distant by a distance D, such that: $H_{pad}/D<2$ and preferably $H_{pad}/D \leq 1$. This distance D can be taken at the tops of the adjacent pads.

According to an example, the crystalline section is silicon-based and preferably, the crystalline section is made of silicon.

The crystalline section can also be with the basis of materials other than Si and which enable the epitaxy of nitride materials. For example, the crystalline section can be SiC- or $Al_2O_3$-based. These materials are further usable in SiCOI form (SiC-on-Insulator) or SOS form (Silicon-on-Sapphire).

According to an example of an embodiment, the crystalline layer having served to form the crystalline section is a monocrystalline layer.

According to an example of an embodiment, the creeping layer is in direct contact with the substrate. The creeping layer is in direct contact with the crystalline section. According to an example of an embodiment, the nitride layer forming each platelet which is produced by coalescence of crystallites is in direct contact with the crystalline section. According to another embodiment, at least one intermediate layer is provided between the crystalline section and the nitride layer, which is produced by coalescence of crystallites and which forms a platelet. This intermediate layer typically forms the buffer layer.

Thus, the creeping layer and the crystalline layer are different. The creeping layer has a vitreous transition temperature. It is therefore made of a vitreous transition material and has the behaviour of vitreous transition materials. Thus, the creeping layer is not crystalline. It is made of a viscous or vitreous material, for example, of an oxide. The creeping layer and the crystalline layer are not made of the same material.

According to an example of an embodiment, the creeping layer has a thickness $e_{220}$ less than 500 nm ($10^{-9}$ metres). It is preferably of between 50 nm and 500 nm, and preferably between 100 nm and 150 nm.

According to an example of an embodiment, the crystalline layer has a thickness of between 2 nm ($10^{-9}$ metres) and 10 μm ($10^{-6}$ metres) and preferably between 5 nm and 500 nm, and preferably between 10 nm and 50 nm.

According to an example of an embodiment, crystals are epitaxially grown on all the pads.

According to an example of an embodiment, the V/III ratio of the flows in the deposition reactor by epitaxy (the flows being, for example, measured in sccm) of said material comprising nitride (N) and at least one from among gallium (Ga), indium (In) and aluminium (Al) is around 2000.

According to an example of an embodiment, the nitride of the platelets is a gallium nitride (GaN). According to another embodiment, the nitride of the platelets is gallium nitride (GaN)-based, and further comprises aluminium (Al) and/or indium (In).

According to another embodiment, the material forming the nitride (N) of the platelets is any one from among: gallium nitride (GaN), indium nitride (InN), aluminium nitride (AlN), aluminium gallium nitride (AlGaN), indium gallium nitride (InGaN), aluminium gallium indium nitride (AlGaInN), aluminium indium nitride (AlInN), aluminium indium gallium nitride (AlInGaN).

According to an example, the step of forming pads comprises the etching of the crystalline layer and the etching of only one portion of the creeping layer, so as to preserve a portion of the creeping layer between the pads.

According to an example, the step of forming pads is carried out, such that $d_{crystallite}/d_{pad} \geq k3$, with k3=3, $d_{pad}$ being the maximum dimension of the cross-section of the pad taken in a direction parallel to a plane (xy), wherein an upper face of the substrate mainly extends (pad or more generally, the edge-to-edge distance of the pad, i.e. the maximum dimension of the pad, whatever the shape of its cross-section), $d_{crystallite}$ corresponding to the dimension of the crystallite measured in the same direction as $d_{pad}$ at the time of coalescence of the crystallites.

Particularly effective results have been obtained for k3=3. According to an example, $100 \geq k3 \geq 3$. Preferably, $50 \geq k3 \geq 3$. Preferably, $5 \geq k3 \geq 3$.

This feature makes it possible for the creeping sections to be deformed to particularly effectively take the mechanical stresses which occur when two adjacent crystallites start to coalesce. Thus, this feature effectively contributes to reducing the density of defects within the nitride platelets that are ultimately obtained.

Preferably, $P_{pad}/d_{pad} \geq 4$, and preferably $P_{pad}/d_{pad} \geq 5$. According to an example which gives particularly qualitative results, $P_{pad}/d_{pad}=5$.

In the description below, the terms "crystals" and "crystallites" will be considered as equivalent.

It is specified that in the scope of the present invention, the terms "on", "surmounts", "covers" or "underlying" or their equivalents, do not mean "in contact with". Thus, for example, "the deposition of a first layer on a second layer" does not compulsorily mean that the two layers are directly in contact with one another, but this means that the first layer covers at least partially the second layer by being either directly in contact with it, or by being separated from it by at least one other layer or at least one other element, including air.

The steps of forming different layers and regions are meant in the broad sense: they can be made up of several substeps which are not necessarily strictly successive.

The terms "substantially", "about", "around", mean "within 10%, preferably within 5%".

Several embodiments of the invention implementing successive steps of the manufacturing method are described below. Unless explicitly mentioned otherwise, the adjective "successive" does not necessarily imply, even if this is generally preferred, that the steps immediately follow one another, intermediate steps being able to separate them.

Moreover, the term "step" means the embodiment of some of the method, and can mean a set of substeps.

Moreover, the term "step" does not compulsorily mean that the actions carried out during a step are simultaneous or immediately successive. Certain actions of a first step can, in particular, be followed by actions linked to a different step, and other actions of the first step can then be resumed. Thus, the term "step" does not necessarily mean single and inseparable actions over time and in the sequence of phases of the method.

The terms "insulator" or "dielectric" qualifies a material, the electrical conductivity of which is sufficiently low in the given application to serve as an insulator. In the present invention, a dielectric material preferably has a dielectric constant less than 7. The spacers are typically formed of a dielectric material.

Materials

By a substrate, a layer, a device "with the basis" of a material M, this means a substrate, a layer, a device comprising this material M only or this material M and optionally other materials, for example alloy elements, impurities or doping elements.

Thus, a "nitride-based layer" can be a layer made only of this nitride or be made of a nitride added with other species or dopants.

For example, a nitride layer or structure made at least partially of a nitride (N) obtained from at least one from among gallium (Ga), indium (In) and aluminium (Al), can be a GaN-, InN-, AlN-, InGaN-, AlGaN-, AlInN-based layer or a structure.

Thickness and Orientation of the Figures

It is specified that in the scope of the present invention, the thickness of a layer or of the substrate is measured in a direction perpendicular to the surface according to which this layer or this substrate has its maximum extension. In the figures, the thickness of the horizontal layers is taken along the vertical, i.e. along the axis z of the system illustrated in FIGS. 2A, 3A and 4, for example.

When it is indicated that an element is located to the right of another element, this means that these two elements are both located on one same line perpendicular to the main plane of the substrate, that is on one same line oriented vertically in the figures.

In the description below, unless indicated on the contrary, when reference is made to absolute position qualificatives, such as the terms "front", "rear", "top", "bottom", "left", "right", etc. or relative, such as the terms "above", "below", "upper", "lower", etc. or to orientation qualificatives, such as the terms "horizontal", "vertical", "lateral", etc., reference is made to the orientation of the corresponding figures, being understood that, in practice, the devices and assemblies described can be oriented differently.

Doping

In the present invention, doping types will be indicated. These dopings are non-limiting examples. The invention covers all the embodiments, wherein the dopings are reversed. Thus, if an example of an embodiment mentions for a first zone, a p type doping and for a second zone, an n type doping, the present description thus describes, implicitly at least, the opposite example wherein the first zone has an n type doping and the second zone, a p type doping.

Conventionally, an n+ doping means that this is an n type doping (doping by negative charges), and the content of doping species of which is greater than or equal to 1 atom of the doping species for less than 1000 atoms of semiconductive and preferably for less than 10 to 100 atoms of the material forming the semiconductive layer. Likewise, a doping referenced p+ means that this is a p type doping (doping by positive charges) and the content of doping species of which is greater than or equal to 1 atom of the doping species for less than 1000 atoms of the semiconductor and preferably for less than 10 to 100 atoms of the material forming the semiconductive layer.

In the present patent application, a doping referenced n includes all the dopings by negative charge carriers, whatever the content of the doping. Thus, an n doping comprises the n+ doping contents and the n doping contents less than the n+ type doping. Likewise, a doping referenced p includes all the dopings by positive charge carriers, whatever the content of the doping. Thus, a p doping comprises the p+ doping contents and the p doping contents less than the p+ type doping.

An electrode is configured to produce an Ohmic contact with the layer with which it is in contact. An electrode can, for example, be one from among a source, a drain, a gate of a transistor. The first electrode forms an anode. The second electrode forms the cathode.

In order to describe in detail, examples of implementation of the invention:

- an example of a method for producing platelets (also called "vignettes" or "discs") will be described in reference to FIGS. 2A to 2F,
- then, examples of vertical components and methods for producing these components from platelets will be described in reference to FIGS. 3A to 13G.

An example of a method for forming platelets made of III-N material will now be described in reference to FIGS. 2A to 2F.

As illustrated in FIG. 2A, a stack is provided, comprising at least one base substrate 100, surmounted successively by a creeping layer 200 and a crystalline layer 300. Thus, the creeping layer 200 is disposed between the base substrate 100 and the crystalline layer 300.

According to an example of an embodiment, the base substrate 100 is silicon-based, amorphous or crystalline. It ensures the mechanical strength of the stack.

The crystalline layer 300 has a lower face facing the creeping layer 200 and an upper face, the function of which is to serve as a base layer to grow nitride platelets 550, 550. For example, the layer which is ultimately sought to be obtained, is a gallium nitride GaN layer. According to an example of an embodiment, the crystalline layer 300 is monocrystalline silicon-based. Alternatively, the crystalline layer 300 can be SiC- or $Al_2O_3$-based.

Preferably, the creeping layer 200 is made of a viscous material. The creeping layer 200, has a vitreous transition temperature. It has the behaviour of vitreous transition materials. Like all materials having a vitreous transition temperature, the creeping layer 200, under the effect of a temperature increase, is deformed without breaking and without going back to its initial position after a temperature drop. On the contrary, the crystalline layer 300 does not naturally have vitreous transition. The crystalline layer is deformed, then is dislocated and can break. Consequently, the creeping layer 200 and the crystalline layer 300 are different. The creeping layer 200 is not crystalline.

The creeping 200 is made of an amorphous material such as an oxide, preferably a silicon oxide SixOy, such as $SiO_2$. The role of this layer will be explained in the description below.

Advantageously but in a non-limiting manner, this stack comprising the base substrate 100, the creeping layer 200 and the crystalline layer 300 constitutes a substrate of the semiconductor-on-insulator type, preferably silicon-on-insulator (SOI). In this case, the creeping layer 200 is formed by the buried oxide layer (BOX) of the SOI substrate.

According to an example of an advantageous embodiment illustrated in FIG. 2A, a buffer layer 400 is deposited, by epitaxy on the upper face of the crystalline layer 300. When the platelets 550, 550 which are sought to be ultimately obtained are formed of GaN, and that the crystalline layer 300 is a silicon-based layer, this buffer layer 400 is typically made of aluminium nitride (AlN). This makes it possible to avoid the so-called "melt-back etching" phenomenon, generated by the very high reactivity between silicon and gallium at usual epitaxy temperatures (1000/1100° C.) and which leads to very highly degrading the GaN platelets 550, 550.

Typically, the thickness of the AlN layer is between 10 and 100 nanometres ($10^{-9}$ metres).

Figure 2B:
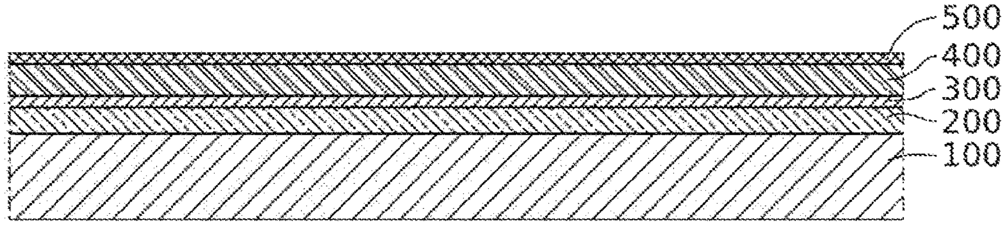

As illustrated in FIG. 2B, a primer layer 500 can also be deposited by epitaxy, on the upper face of the buffer layer 400. This primer layer 500 has the function of facilitating the resumption of growth of the crystallites 510 during following steps. In this case, it is from an upper face of the primer layer 500 that the epitaxial growth of the crystallites 510A1-510B4 at least partially occurs, the crystallites being illustrated in FIG. 2D. This primer layer 500 is preferably made of the same material as that of the platelets 550, 550 that are sought to be ultimately obtained. Typically, when the material of the platelets 550, 550 is gallium nitride GaN, the primer layer 500 is also made of GaN. This primer layer 500 typically has a thickness of between 50 and 200 nanometres.

It will be noted that the layers 400 and 500 are only optional. Thus, according to non-illustrated embodiments in FIG. 2A-2F, only the buffer layer 400 or only the primer layer 500, or also none of these two layers 400 and 500 can be provided.

Figure 2C:
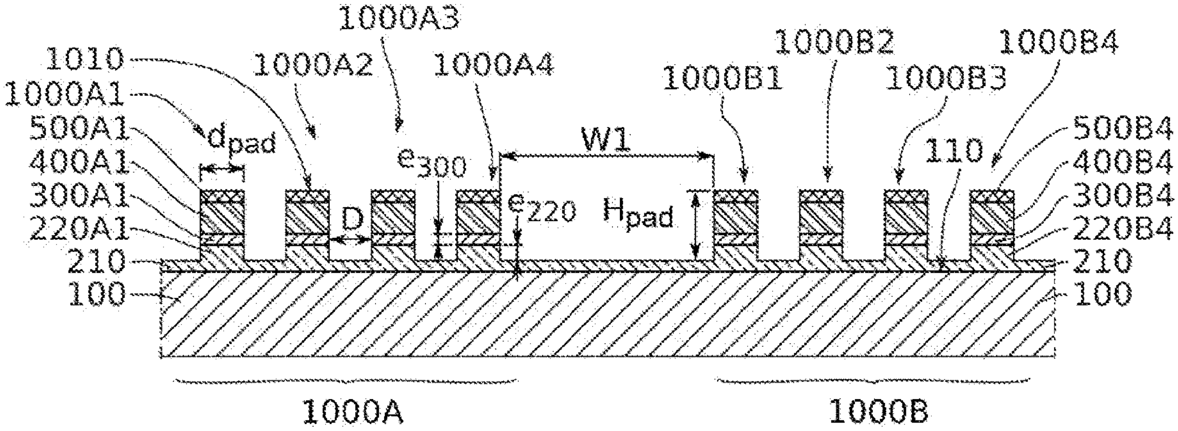

As illustrated in FIG. 2C, pads 1000A1-1000B4 are then formed from the stack. These pads are obtained by etching of the stack to the creeping layer 200, at least some of the etching extending within the creeping layer 200. Thus, and as clearly illustrated in 2C, for example, the pads are separated from one another. In particular, their tops are not joined. Their tops do not touch one another. The same applies for their crystalline sections.

To form the pads by etching, numerous etching techniques known to a person skilled in the art can be resorted to. Conventional lithographic techniques can, in particular, be used, such as photolithographic techniques comprising the formation of a mask, for example made of resin, then the transfer of patterns of the mask in the stack. E-beam lithographic techniques or nanoimprint techniques can be resorted to.

For concision and clarity, only four pads 1000A1-1000A4 are represented in the figures to support one same platelet 550. Naturally, a platelet 550 can be formed of a greater number of pads. As will be described below, the number of pads, as well as their period will be adapted according to the desired size for the microelectronic device, such as a power transistor, a p-i-n diode or a Schottky diode for example, which is sought to be produced from this platelet.

These pads 1000A1-1000B4 are of small dimensions and can be qualified as nano-pads or nano-pillars. Typically, the maximum dimension of the cross-section of the pads, taken in a plane parallel to the plane xy of the orthogonal system xyz or to the plane of the upper face of the base substrate 100, is comprised between a few tens and a few hundred nanometres. This maximum dimension of the cross-section of the pads is referenced $d_{pad}$ in FIG. 2C. If the pads are of circular cross-section, this maximum dimension $d_{pad}$ corresponds to the diameter of the pads. If the pads are of hexagonal cross-section, this maximum dimension $d_{pad}$ corresponds to the diagonal or to the diameter of the circle passing through the corners of the hexagon. If these pads are of rectangular or square cross-section, this maximum dimension $d_{pad}$ corresponds to the largest diagonal or to the side of the square. It can be provided that all the pads do not have the same dimension, in particular by the same cross-section. Preferably, $d_{pad}$ is between 10 and 1000 nanometres and preferably between 20 and 150 nm, and preferably between 50 and 100 nm, for example around 50 nm or 100 nm. According to an example, each pad has a constant cross-section over the whole of its height $H_{pad}$. Thus, the top of the pad has an identical cross-section, or substantially identical to its base.

The pads 1000A1-1000B4 are not all regularly distributed on the surface of the base substrate 100. The pads 1000A1-1000B4 form pad assemblies 1000A, 1000B, each assembly comprising a plurality of pads. The pads 1000A1-1000A4 forming one same assembly 1000A defining a pad array distant from the pad 1000B1-1000B4 array forming another assembly 1000B.

Thus, the adjacent pads 1000A1-1000A4 of one same assembly 1000A are distant by a distance D. The adjacent pads 1000A4-1000B1 belonging to two distinct assemblies 1000A, 1000B are separated by a distance W1. The distances D and W1 are taken in planes parallel to the plane xy and are illustrated in FIG. 2C. The distances D and W1 are taken, for example, at the tops of the adjacent pads. As will be explained below, the pads 1000A1-1000A4 of one same assembly 1000A are intended to support one single platelet 550 which will be distance from another platelet 550B supported by another pad 1000B1-1000B4 assembly 1000B.

It will be noted that for one same platelet, the distance D can vary. Thus, the pads 1000A1-1000A4 of one same platelet 550 can be non-periodically distributed. Their distribution can thus be adapted to favour the growth of the platelet or to favour the controlled detachment of some of the platelet with respect to the base substrate 100. For example, if the arrangement of the pads 1000A1-1000A4 of a platelet 550 is not periodic, a distance D can be had, which varies for these pads 1000A1-1000A4, plus or minus 20% or plus or minus 10%, for example plus or minus 10 nm around an average value. According to an example, D can take the following values for one same platelet: 100 nm, 90 nm, 85 nm, 107 nm.

The platelets 550, 550 formed on pad 1000A, 1000B assemblies non-periodically distributed can themselves be periodically disposed on the base substrate 100.

According to an example of an embodiment, the sections of the pads 1000A1-1000B4, formed in the creeping layer 200, have a height $e_{220}$ and, within one same assembly, two adjacent pads 1000A1, 1000A2 are distant by a distance D, such that:

$e_{220}/D<1$, and preferably, $e_{220}/D<1.5$. Preferably, $e220/D<2$.

According to an example of an embodiment, the pads have a height $H_{pad}$ and two adjacent pads are distant by a distance D, such that:

$H_{pad}/D<2$, and preferably, $H_{pad}/D<1.5$. Preferably, $H_{pad}/D\leq 1$.

$H_{pad}$ and e220 are measured in the direction z. D is measured parallel to the plane xy. $H_{pad}$, $e_{220}$ and D are illustrated in FIG. 2C.

As illustrated in FIG. 2C, the pads are etched through the whole primer layer 500, the whole buffer layer 400 (when the latter are present), the whole crystalline layer 300. Preferably, only one portion 220 of the creeping layer 200 is etched. This embodiment has the advantage of avoiding that during epitaxy, the nitride of the platelets 550, 550 is developed on the creeping sections 220. This selectivity of the epitaxy is encountered, in particular when the nitride platelets 550, 550 which are epitaxially grown are made of GaN, and that the creeping sections are made of $SiO_2$. On the contrary, if, with these same materials, the creeping layer 200 is etched over the whole of its thickness, thus, during epitaxy, the nitride of the platelets 550, 550 is developed from the upper face of the base substrate 100, usually formed of silicon. This situation is clearly not desirable.

Moreover, it has been observed that the action of preserving a non-etched portion 210 of the creeping layer 200 makes it possible to facilitate the creeping of the section 220, in particular when the crystallites are disoriented by twisting, i.e. in main extension planes of the platelets 550, 550 which are sought to be obtained. These main extension planes of the platelets 550, 550 are parallel to the plane xy of the system xyz.

Preferably, the etched thickness e220, and therefore forming the height of the creeping section 220, is equal to at least half of the thickness of the creeping layer 200. This makes it possible to have a very good reorientation of the crystallites during the formation of grain boundaries.

Figure 2D:
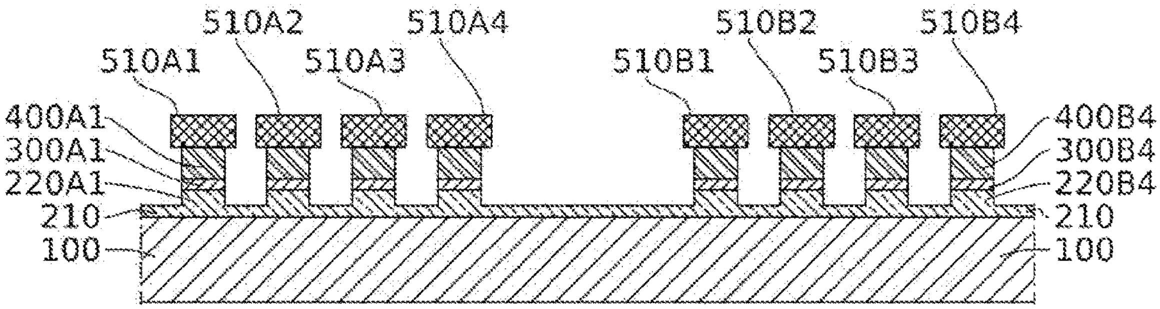

FIG. 2D illustrates the formation of crystallites 510A1-510B4 by epitaxial growth from the primer layer 500 (or from the upper face of the crystalline layer 300 when the layers 400 and 500 are absent).

As illustrated in this FIG. 2D, the pads 1000A1-1000B4 each support a crystallite 510A1-510B4 carried by a stack of sections 400A1-400B4, 300A1-300B4, 220A1-220B4. The sections extend in the main extension direction of the pad, i.e. vertically (z) in FIGS. 2A to 2F.

Whatever the embodiment retained, i.e. with or without primer layer 400 and with or without buffer layer 500, the epitaxial growth of the crystallites 510A1-510B4, is carried out at least partially or only from the upper face of the pad 1000A1-1000B4, also referenced top 1010 of the pad. Thus, this upper face is formed, either by the crystalline section 300A1-300B4, or by the section formed by the primer layer 400A1-400B4, or by the section formed by the buffer layer. This makes it possible, in particular, to rapidly obtain crystallites 510A1-510B4 of high thickness.

Figure 2E:
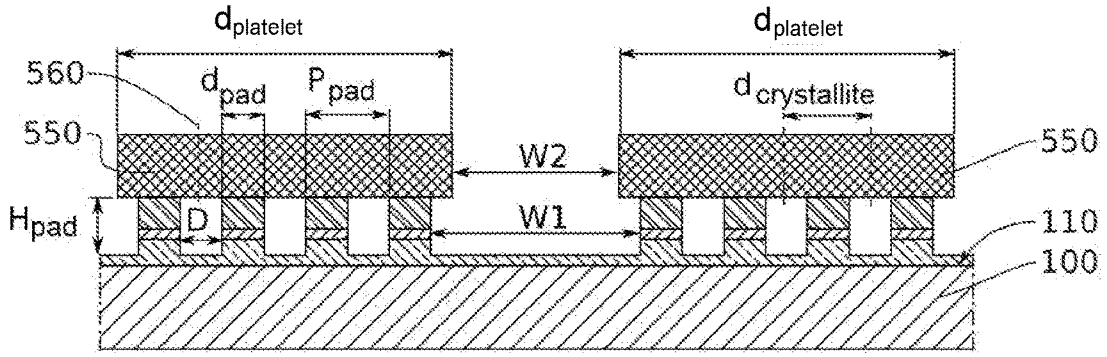

It will be noted that the upper faces of the buffer layer 400 and of the primer layer 500, i.e. the faces rotated facing the layer of the platelets 550, 550 which are sought to be grown, have polarities of the gallium (Ga), and not nitrogen (N) type, which considerably facilitates the obtaining of high quality epitaxial nitride platelets 550, 550. The growth of the crystallites 510A1-510B4 is continued and extends laterally, in particular along planes parallel to the plane xy. The crystallites 510A1-510B4 of one same pad 1000A1-1000A4 assembly 1000A are developed until coalescing and forming a unit or platelets 550, 550 as illustrated in FIG. 2E.

In other words, and as clearly emerges from the figures, each platelet 550, 550 extends between several pads 1000A1-1000A4. Each platelet 550, 550 forms a continuous III-N material layer.

This growth of the crystallites 510A1-510B4 does not extend downwards. Moreover, this growth is selective, in that it does not occur on the creeping layer 200 typically made of an oxide. In this sense, the growth of the crystallites 510A1-510B4 is carried out according to the pendeo-epitaxy principle.

It will be noted that it is particularly advantageous to etch the pads 1000A1-1000B4 after formation by epitaxy of the buffer layer 400 and of the primer layer 500 (when these layers are present). Indeed, if one of these layers 400, 500 was deposited after etching, it would be partially formed at least between the pads 1000A1-1000B4 on the upper face of the creeping layer 200. In the case where the epitaxial nitride is made of GaN, that the creeping layer 200 is made of $SiO_2$, thus, at the temperature of the epitaxial deposition, the epitaxial growth of the nitride platelets 550, 550, but on the contrary, would also occur between the pads 1000A1-1000B4, which naturally is not desirable.

Particularly advantageously, the temperature $T_{epitaxy}$ at which epitaxy is carried out is greater than or around the vitreous transition temperature $T_{vitreous\ transition}$ of the creeping layer 200. Thus, during epitaxy, the creeping sections 220A1-220A4 are brought to a temperature which makes it possible for them to be deformed.

Consequently, if the crystallites 510A1-510A2 carried by two adjacent pads 1000A1-1000A2 are disoriented against one another, during the coalescence of these two crystallites, the boundary 560 formed at their interface, usually called grain boundary of coalescence boundary, will be formed without dislocation to make up for these disorientations. The approximate placement of the boundary 560 is illustrated in FIG. 2E. The deformation of the creeping sections 220 thus makes it possible to make up for these disorientations and to obtain platelets 550, 550 without or with very few dislocations at the coalescence boundaries. It will be reminded that the pads 1000A1-1000A2 are not joined, in particular they are not joined at their tops, which makes it possible for them to be deformed independently from one another, such that the crystallites 510A1-510A2 can be oriented to minimise the energy of the system.

Thus, from step 2E, a plurality of platelets 550, 550 is obtained, each platelet 550 being supported by the pads 1000A1-1000A4 of one same pad assembly 1000A. Two adjacent platelets 550, 550 are separated by a distance W2, W2 being the lowest distance taken between these two platelets. W2 is measured in the plane xy.

W2 depends on W1, on the duration and on the speed of the epitaxial growth. W2 is non-zero. W2<W1.

The maximum dimension $_{platelet}$ of a platelet measured parallel to the plane xy is noted $d_{platelet}$. Thus, $d_{platelet}$ corresponds to the maximum dimension of a projection of the platelet in a plane parallel to the plane xy. Preferably, 0.8 $\mu m \le d_{platelet} \le 1000$ μm and preferably, 1 $\mu m \le d_{platelet} \le 200$ μm. $d_{platelet}$ depends on the speed and on the duration of the epitaxial growth, as well as on the number, on the dimension and on the step $p_{pad}$ of the pads of one same assembly. To produce vertical MOSFETs, $d_{platelet}$ will be, for example, around a few tens of μm.

FIG. 2E illustrates a non-limiting embodiment, wherein layers having different doping types are produced within the layer made of III-N material of each platelet 550, 550. To produce these different doped layers within each platelet 550, 550, a person skilled in the art can implement the known solutions of the state of the art. Preferably, the doping of each of these layers can be carried out during the epitaxial growth of the crystallites.

Figure 2F:
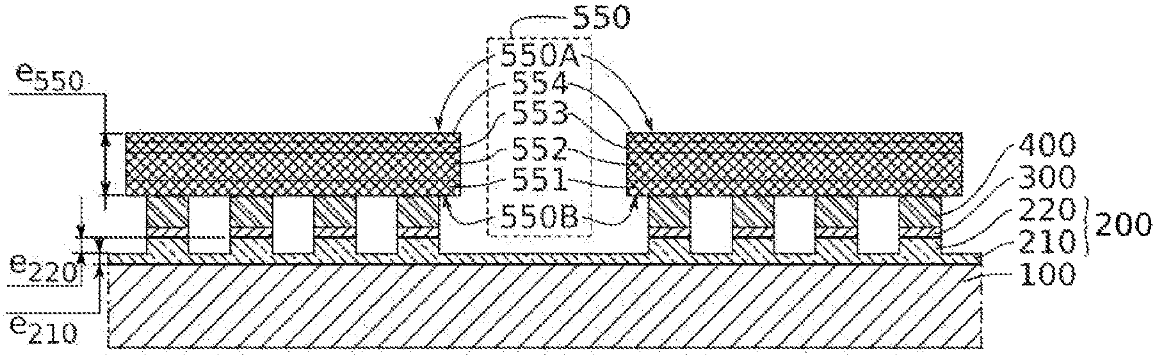

As illustrated in FIG. 2F, it can be provided that the platelet 550 has, from its rear face 550B rotated facing the base substrate 100 and to its front face 550A, the following layers:

- a layer 551, made of III-N material, having for example, an n+ type doping;
- a layer 552, made of III-N material, having for example, an n− type doping;
- a layer 553, made of III-N material, having for example, a p type doping;
- a layer 554, made of III-N material, having for example an n+ type doping.

This example of doping is not limiting. For example, the features, steps and technical effects described above are fully applicable to layers of III-N material having only some of these layers 551-554, or having another combination of layers, or also having additional layers.

In the examples illustrated in FIGS. 2A-2F, the layer 551 is the layer formed by coalescence of the crystallites which epitaxially grow on the pads 1000. According to another embodiment, the layer formed by coalescence of the crystallites which epitaxially grow on the pads 1000 is an initial layer, referenced **550*i* in FIG. 4, different from the layer 551. The latter embodiment has the advantage of more specifically controlling the dopings of the layer 551. All the embodiments described above and below are fully replaceable by embodiments, with or without an initial layer 550*i* between the pads and the first layer 551**.

Examples of Features to Reduce the Dislocations at the Coalescence Boundaries

Generally, to obtain a coalescence of the crystallites without dislocation, the following parameters can be adjusted:

The “mechanical rupture” properties of the material forming the creeping section at a high temperature under relatively low stresses of 500 MPa.

The sufficiently small size $d_{pad}$ of the support pads 1000A1-1000A4 compared to the distance D between the pads of one same assembly 1000A, makes it possible to create a stress in the creeping section which is, for a given rotation torque, greater than the rupture stress.

Moreover, as indicated above, it will be ensured that the epitaxial temperature $T_{epitaxy}$ makes the creeping of the creeping section 220 possible. In practice, $T_{epitaxy} \ge 600°$ C. (in the scope of a molecular jet epitaxy), $T_{epitaxy} \ge 900°$ C. and preferably $T_{epitaxy} \ge 1000°$ C. and preferably, $T_{epitaxy} \ge 1100°$ C. These values make it possible to particularly effectively reduce the defects in the platelet or the epitaxial layer when the creeping layer is made of $SiO_2$. In practice, $T_{epitaxy} \le 1500°$ C.

In order to facilitate the formation of coalescence boundaries 560 without dislocation, it will be preferable to apply the following conditions:

$T_{epitaxy} \ge k1 \times T_{vitreous\ transition}$, with k1=0.8, preferably, k1=1 and preferably, k1=1.5.

According to an example of an embodiment, $T_{epitaxy} \le k2 \times T_{min\ melting}$, $T_{min\ melting}$ being the lowest melting temperature from among the melting temperatures of the sections forming the pad. This is mainly the crystalline section and the creeping section. According to an example of an embodiment, k2=0.9. This makes it possible to avoid a diffusion of the species of the material, the melting temperature of which is the lowest.

Thus, in the case where the pad is formed of creeping sections made of $SiO_2$ and of crystalline sections made of silicon, $T_{epitaxy}$≤1296° C. Indeed, $T_{min\ melting}$ is equal to the melting temperature of silicon, since the melting temperature of silicon is equal to 1440° C. and the melting temperature of $SiO_2$ is equal to 1970° C.

Advantageously, the step of forming the pads 1000A1-1000A4 is carried out such that $d_{crystallite}/d_{pad}$≥k3, $d_{pad}$ being the maximum dimension of the cross-section of the pad 1000A1-1000A4 taken in a direction parallel to the plane, wherein the upper face of the base substrate 100 extends. Thus, $d_{pad}$ corresponds to the maximum dimension of a projection of the pad into the plane xy. $d_{crystallite}$ corresponds to the dimension of the crystallite measured in the same direction as $d_{pad}$ at the time of coalescence of the crystallites 510A1-510B4.

According to an example, 100≥k3≥1.1. Preferably, 50≥k3≥1.5. Preferably, 5≥k3≥2.

According to an example k3≥3, preferably, 100≥k3≥3. Preferably, 50≥k3≥3. Preferably, 5≥k3≥3.

This feature makes it possible for the creeping sections to be deformed to particularly effectively take the mechanical stresses which occur when two adjacent crystallites starting to coalesce. Thus, this feature effectively contributes to reducing the density of defects within the nitride platelets 550, 550 which are ultimately obtained.

Examples of Embodiments of a Vertical Component from Platelets Made of III-N Material A first example of an embodiment of a vertical component from epitaxial platelets will now be described in detail, in reference to FIGS. 3A to 3J.

A first step consists of providing a stack comprising the base substrate 100 supporting several platelets 550. Each of these platelets 550 comprises a layer of III-N material formed of several sublayers, each sublayer having dopings of different types. The method according to the invention is not limited to a certain number of doped layers, to certain types of doping or also to a certain combination of dopings.

As illustrated in FIG. 3A, an encapsulation layer 600 is produced, which covers the platelets 550. This encapsulation layer 600 covers both the rear face 550B, as well as the front face 550A of the platelets 550. This encapsulation layer 600 has the function of stabilising the platelets 550 before the following technological steps. Moreover, it protects the front face 550A.

This encapsulation layer 600 is, for example, a dielectric layer, deposited by centrifugation. Typically, this is a SOG (Spin On Glass) layer, mainly comprising $SiO_2$ and optionally other species.

Figure 3B:
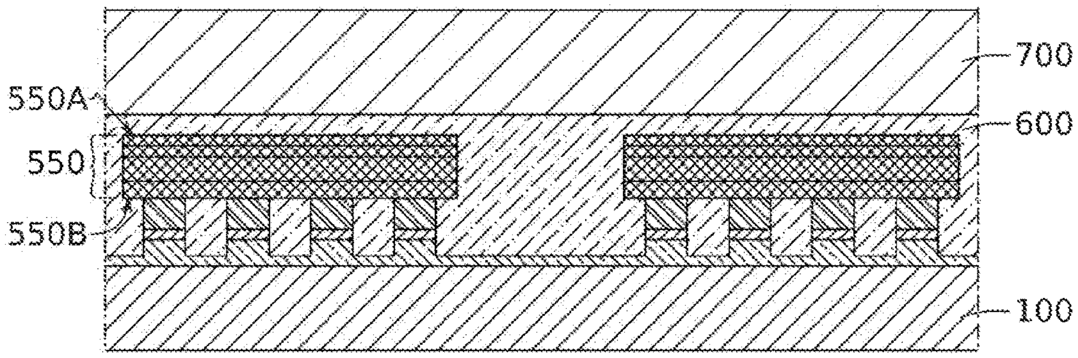

As illustrated in FIG. 3B, a sacrificial substrate 700 is then mounted on the encapsulation layer 600. This encapsulation layer 600 thus also has the function of forming a surface facilitating the fixing, for example by bonding, with the sacrificial substrate 700.

As illustrated in FIG. 3C, the assembly comprising the two substrate 100, 700, as well as the platelets 550 maintained in the encapsulation layer 600 are then returned.

Figure 3E:
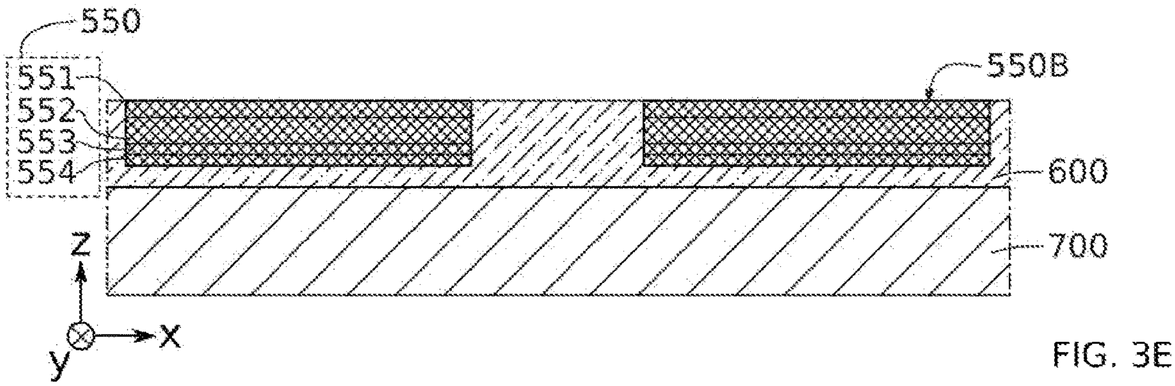

The following steps aim to make the platelet 550 made of III-N material accessible, as illustrated in FIG. 3E. More specifically, it is sought to make the layer 551 accessible, which defines the rear face 550B of the platelet 550 of the vertical component. Preferably, this first layer 551 is n+ doped. This makes it possible to ensure a good electrical connection with the electrode which will be in contact with it.

For this, according to a first embodiment, the base substrate 100 is removed, as illustrated in FIG. 3D1. Then, the assembly of layers surmounting the rear face 550B of the platelet 550 can be removed. For this, one or more conventional material removal steps can be proceeded with, taken from among: a grinding step, a chemical mechanical polishing (CMP) step, an etching step.

According to another embodiment, illustrated in FIG. 3D2, a mechanical delamination can be proceeded with at the pads 1000. The application of a mechanical stress, in particular, makes it possible to break the pads 1000 at the creeping sections 220. Then, the removal of the different layers which surmount the rear face 550B of the platelet 550 is proceeded with. For this, one or more of the grinding, CMP or etching steps mentioned above can be resorted to.

As illustrated in FIG. 3E, the platelet 550 is thus made accessible. It can be provided to remove a portion of the thickness of this platelet or on the contrary, to be stopped on the initial lower face 550B.

If, as indicated above, the platelet 550 has an initial layer 550*i* which results from the coalescence of the crystallites 510 on the pads 1000, and which is not the doped layer 551, thus, this initial layer 550*i* is also removed.

In the non-limiting example illustrated in this FIG. 3E, each platelet 550 has the following layers from the rear face 550: an n− doped layer 551, a p doped layer 552, an n+ doped layer 553.

Figure 3F:
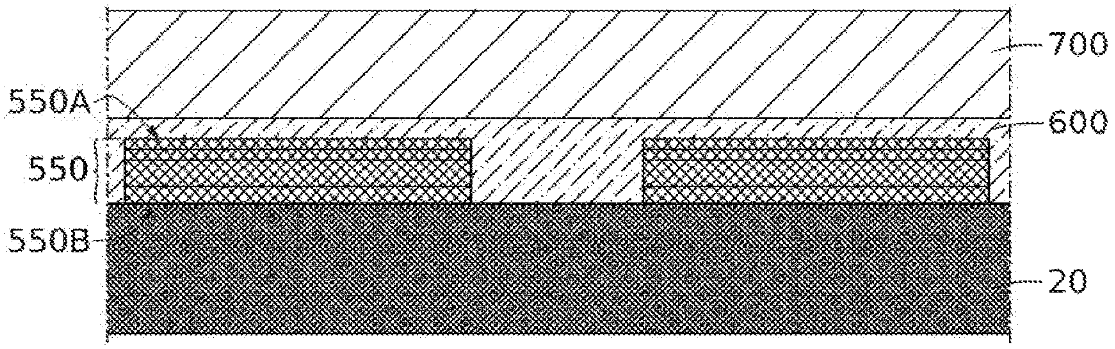

Then, an electrode 20 is produced, making it possible to form an Ohmic contact with the layer 550 made of III-N material. This step is illustrated in FIG. 3F. To produce this electrode 20, a base can be electrically conductively mounted on the accessible face of the platelets 550. This is typically a plate or an electrically conductive substrate. This can also be a conductive layer, a conductive coating on a base or a support, whatever it is.

Figure 3G:
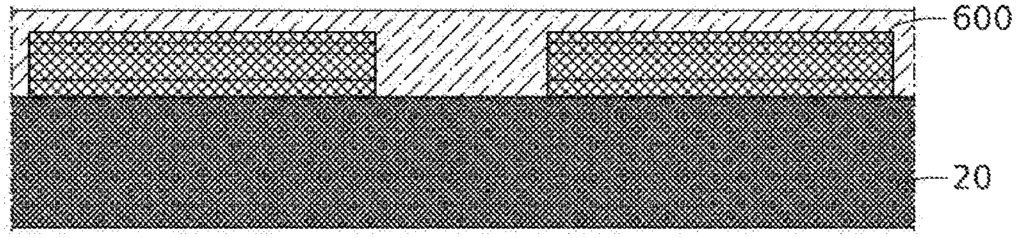

As illustrated in FIG. 3G, the sacrificial substrate 700 is then removed.

Figure 3H:
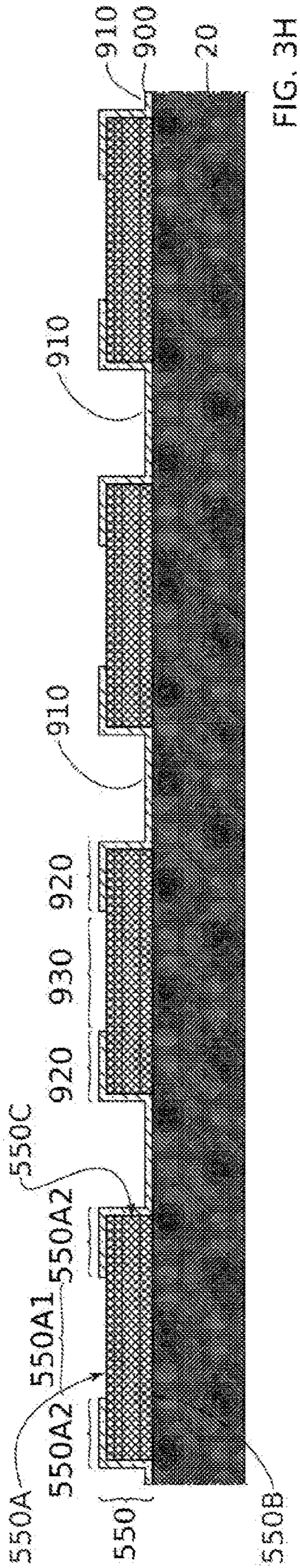

As illustrated in FIG. 3H, then a mask 800 is produced, partially covering the platelets 550 while leaving a first zone 550A1 of the front face 550A of the platelets accessible, and by masking a second zone 550A2 of the front face 550A of the platelets. Thus, for each platelet 550, the mask 900 has one or more portions 920 which cover the second zone 550A2 and one or more openings 930 which leave the platelet 550 accessible.

Preferably, the first zone 550A1 extends from the centre of the front face 550A of the platelets 550 and the second zone 550A2 surrounds the first zone 550A1. The mask 900 extends to the periphery of the front face 550A and also covers the flanks 550C of the platelets 550. The mask 900 also has portions 910 which extend between two adjacent platelets 550.

The mask 900 is preferably made of a dielectric material. This can be $SiO_2$.

This mask 900 can be formed by partial etching of the encapsulation layer 600. Alternatively, this mask 900 can be formed by a deposition then a lithography, these two steps being carried out after removal of the encapsulation layer 600.

Figure 3I:
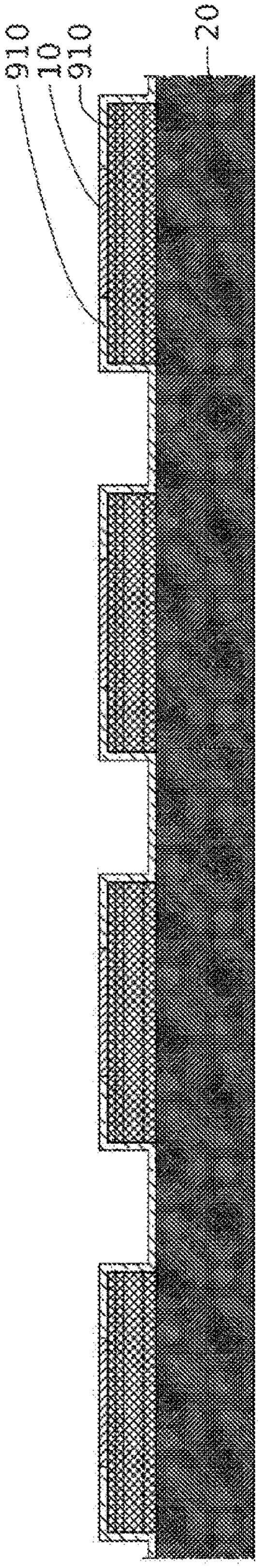

As illustrated in FIG. 3I, an electrically conductive material is deposited in the openings 930 of the mask 900. This conductive material forms an electrode 10 for the vertical component.

The vertical component thus has a first electrode 10 and a second electrode 20. A current passing from one of these electrodes to the other thus passes through the thickness of the layer of III-N material of the platelet 550.

In the non-limiting example illustrated, the vertical component is a transistor. The electrode 10 acts as a source, the electrode 20 acts as a drain. Also, an additional and optional step is carried out to form an additional electrode 30 acting as a gate. For this, an electrically conductive layer is deposited, typically forming the gate metal. This electrode 30 is deposited between the platelets 550 and covers some of the portions 920 of the mask 900. Thus, the electrode 30 comprises:

- a portion 30A which covers some of the portions 920 of the mask 900,
- a portion 30B which covers the mask 900 on the flanks 550C of the platelets,
- portion 30C which covers the mask 900 between the platelets 550.

Thus, in the non-limiting embodiment described above, the gate is deposited on the vertical components, without being etched. Thus, the method proposed makes it possible to preserve the features of the gate, as it is not etched. This makes it possible to considerably improve the performance of the power components. In particular, this makes it possible to improve the threshold voltage, the mobility in the channel and to reduce the trapping in the oxide which has an impact on the threshold voltage and its reliability. Moreover, the gate can have a low thickness.

For example, the pads 1000 of one same assembly form a honeycomb structure, also called honeycomb array. For example, each pad 1000 has a hexagonal shape.

It clearly emerges from the non-limiting example described above, that the method proposed makes it possible to avoid the disadvantages associated with the delimitation etching of the different vertical components. Particularly advantageously, the platelets made of III-N material each correspond in their shape and their dimension to one of the electrodes of the vertical component, for example to the source of a vertical transistor. Moreover, due to their production method, the material of the platelets is completely relaxed and only contains very few dislocations. The dislocation rate is typically less than $1^{E}8/cm^2$. Preferably, it is less than $1^{E}7/cm^2$, preferably, it is around $1^{E}6/cm^2$.

The method proposed thus makes it possible to obtain a vertical component, in this case, a transistor, with the basis of a III-N material having a high thickness, a great purity and a low density of dislocations.

Moreover, a considerable advantage of the method proposed is the cost price reduction and the increase in diameter of the plates, with respect to the solutions based on freestanding or bulk GaN plates, which only exist in a diameter less than or equal to 100 nm. Currently, the most known solution for manufacturing the freestanding GaN plates is the epitaxy of layers by HVPE (Hybrid Vapour Phase Epitaxy) on a substrate like sapphire. The growth is carried out so as to decrease the density of dislocations on the surface, and to have a final layer which is a few hundred μm thick. With these known solutions, the sapphire substrate can therefore be removed, by leaving a GaN layer which could be used as a plate. This solution is long and expensive. Furthermore, it is difficult to implement on large diameter plates.

On the contrary, by growing platelets as indicated above in reference to FIGS. 2A to 2F, it is possible to obtain 200 mm or 300 mm silicon plates. With these platelets, very thick GaN layers with a low density of dislocations can be made, enabling the manufacture of vertical components. An additional advantage of working on 200/300 mm plates is to give access to very advanced technologies which do not exist for plates of a diameter of 100 mm. Moreover, generally in the microelectronics industry, the increase in size of the plates has an interest of decreasing the cost per chip and therefore per product, and of increasing the yield for each plate, particularly for large components, like vertical power components.

FIGS. 5A to 5D illustrate other component structures which can be obtained by implementing the method according to the invention.

Figure 4:
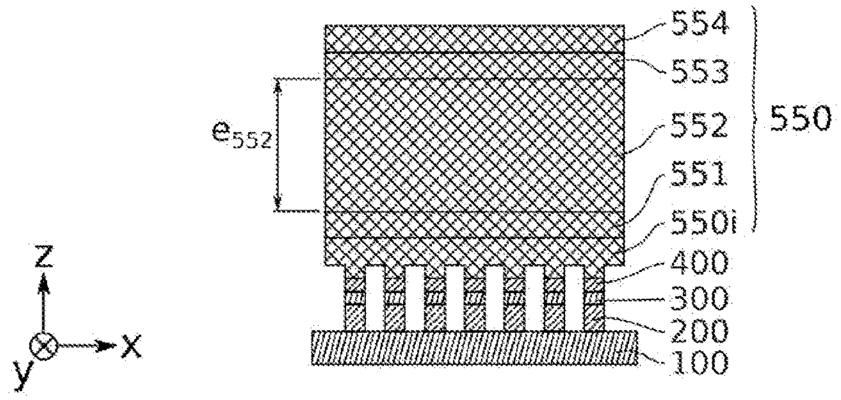
FIG. 4 illustrates an example of a platelet intended to form vertical components.

The structures of these FIGS. 5A to 5D are preferably produced from a platelet 550 as that illustrated in FIG. 4.

The platelet 550 of FIG. 4 can be obtained by implementing the method described above in reference to FIGS. 2A to 2F. This platelet 550 comprises the layers 550*i*, 551, 552, 553, 554 described above. As mentioned above, it is possible to obtain a platelet with no initial layer 550*i*.

Figure 3J:
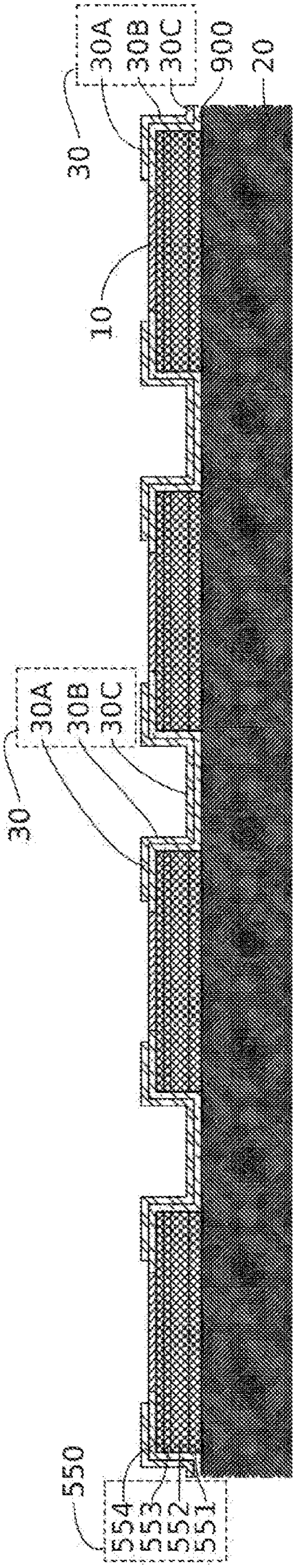
Figure 5A:
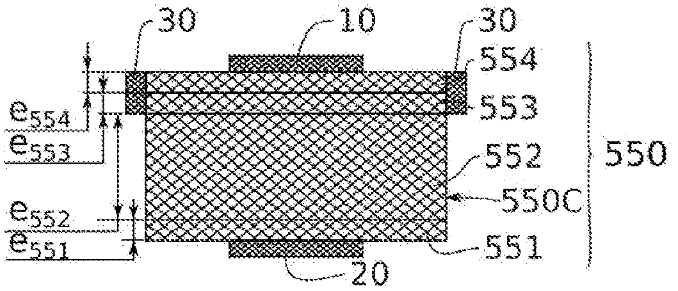
FIGS. 5A to 5D illustrate examples of vertical components which can be formed from the platelet of FIG. 4 and by implementing the method according to the invention.

FIG. 5A illustrates a vertical transistor close to that illustrated in FIG. 3J. Indeed, this vertical transistor comprises:

- a source 10 and a drain 20 disposed respectively on the faces 550A and 550B of the layer made of III-N material, the face 550A being formed by the fourth layer 554 and the face 550B being formed by the first layer 551,
- a gate 30 disposed on the flanks 550C of the platelet and thus surrounding the layer made of III-N material over at least some of its height.

In this example, the gate 30 is directly in contact with the layers 553 and 554. It is not in contact with the layer 552.

Figure 5B:
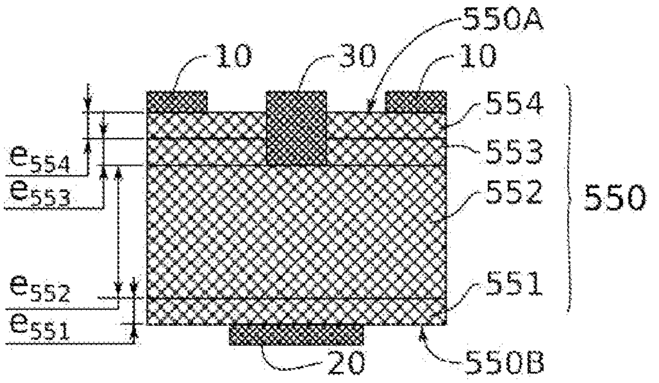

FIG. 5B illustrates another example of a vertical transistor wherein the gate 30 is etched through at least some of the doped layers of the III-N material. In this example, the gate 30 passes through the layers 554 and 553. The source 10 extends over the front face 550A and surrounding the gate 30. Naturally, the source 10 is disposed at a distance from the gate 30 to avoid any short-circuit.

Figure 5C:
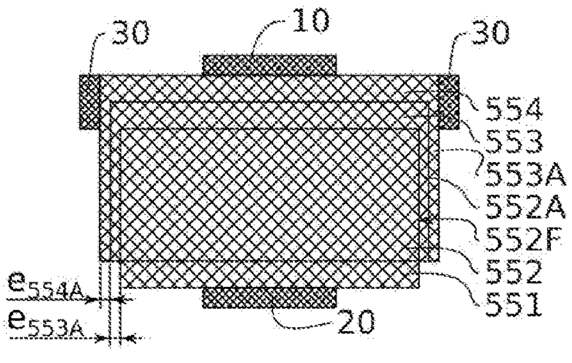
Figure 5D:
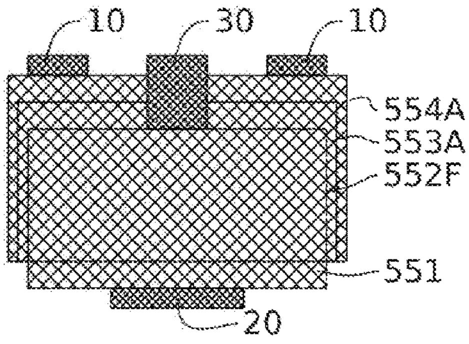

FIGS. 5C and 5D illustrate vertical components close to those illustrated in FIGS. 5A and 5B respectively to the difference that lateral portions of the layers 553 and 554 cover some of the flanks 552F of the layer 552. The portions of layers 553 and 554 which cover the flanks 552F are referenced 553A and 554A.

The growth on pads, mesa or islands is carried out often on all the surfaces, with a more or less high speed, according to the growth conditions and the orientation of the flanks of the layer made of III-N material. This could be problematic for the growth of the p-n junction on the surface of the platelet 550. Indeed, during the growth of these layers on the surface, the growth of a p-n junction of the flanks could also be had. Although this thickness is usually low, this junction could give uncontrolled conduction paths and generate a high leakage current, as it would thus be difficult to control it with the gate. The performance of the transistor would thus be highly deteriorated.

In the scope of the present invention, it is possible to take advantage of this aspect. Indeed, if the thicknesses $e_{553A}$ and $e_{554A}$ of the III-N material (typically p and n layers, preferably pGaN and nGaN) are well targeted, with the correct doping, it can be ensured that the junction is completely depleted. The layers 553A, 554A which cross over the flanks 552F thus have no free carriers, and will have a high resistivity. They will thus form a barrier preventing electrons from reaching the surface of the flanks of the platelet 550. This deserted p-n junction thus acts as passivation layers for the flanks of the platelet 550. This avoids having to add specific passivation layers. The method for producing the component is thus simplified and its cost price is reduced.

Preferably, the growth of the layers 553, 554 is carried out such that the lateral portions 553A and 554A cover the whole height of the flanks 552F of the second layer 552. Thus, the flanks 552F of the second layer 552 are fully protected and are no longer accessible.

In each of the embodiments described above in reference to FIGS. 4 to 5D, one single component and one single cell are produced per platelet. According to another embodiment, several components or several cells can be produced on one same platelet. Thus, for example, several gates can be provided through at least some of the doped layers of the III-N material of one same platelet. Thus, the same platelet is in contact with several gates. Several components are thus produced by platelets. Indeed, in particular for MOS technologies, there is an interest in making several cells or components on one same platelet. A component can also be composed of several cells, each with a gate.

This embodiment is particularly interesting, if the platelet edges or mesas have too many impurities to have a very low doping. In this case, it will thus be interesting to produce large platelets with several cells for each platelet.

The paragraphs below give details, for a non-limiting example of an embodiment, of different layers forming the III-N material. In this non-limiting example, the III-N material is GaN-based. Preferably, the III-N material is GaN.

For example, the first layer 551 can have a thickness $e_{551}$ of between 1 and 5 μm ($10^{-6}$ metres), preferably of between 1 and 3 μm, preferably of around 2 μm. This first layer 551 has an n+ type doping. This makes it possible to ensure a good quality electrical conduction with the second electrode 20. For example, this first layer 551 has a doping level greater than or equal to 5·1017 atoms per cubic centimetre (at/cm$^3$) and preferably around 5·1018 at/cm$^3$. For example, the first layer has a doping level, preferably of around 5·1018 at/cm$^3$. As illustrated in FIG. 3D to 13D, the first layer 551 extends from one flank 550C to the other of the platelet 550. It extends over the whole surface of the platelet 550. The surface of the platelet is projected over a parallel plane (plane xy), wherein the upper face of the substrate 100 mainly extends.

The second layer 552 can have a thickness $e_{552}$ of at least 8 μm ($10^{-6}$ metres) and preferably of at least 10 μm. Thus, this layer 552, relatively thick, fully suits power components. The second layer 552 has a doping level greater than or equal to 1·1015 at/cm$^3$ and preferably, around 1·1016 at/cm$^3$. The second layer 552 has an n− type doping. As illustrated in FIG. 3E to 13D, the second layer 552 extends from a flank 550C to the other of the platelet 550, except for in the embodiments where it is covered, at the flanks, by a third 553 or a fourth layer 554. The second layer 552 extends over the whole surface of the platelet 550.

The third layer 553 can have a thickness $e_{553}$ of at least 100 nm ($10^{-9}$ metres) and preferably of less than 1 μm. Preferably, the thickness $e_{553}$ is of between 300 and 700 nm. According to an example, the thickness $e_{553}$ is equal to 500 nm. The third layer has a doping level greater than or equal to 5·1017 at/cm$^3$ and preferably around 1·1018 at/cm$^3$. It has a p type doping. As illustrated in FIG. 3E to 9, the third layer 553 extends from a flank 550C to the other of the platelet 550, except for in the embodiments where it is covered, at the flanks, by a fourth layer 554. The third layer 553 extends over the whole surface of the platelet 550.

The fourth layer 554 can have a thickness $e_{554}$ of at least 50 nm ($10^{-9}$ metres). Preferably, the thickness $e_{554}$ is between 50 and 300 nm. Preferably, the thickness $e_{554}$ is around 100 nm. The fourth layer 554 has a doping level greater than or equal to 5·1017 at/cm$^3$ and preferably, around 1.1018 at/cm$^3$. It has an n+ type doping. This makes it possible to ensure a good quality electrical conduction with the first electrode 10. As illustrated in FIG. 3E to 5D, the fourth layer 553 extends from one flank 550C to the other of the platelet 550. It extends over the whole surface of the platelet 550.

Figure 6:
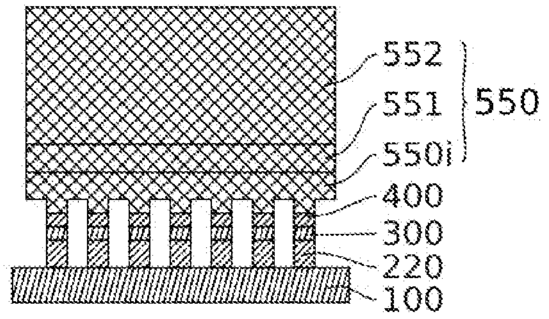
FIG. 6 illustrates another example of a platelet intended to form vertical components.
Figure 7:
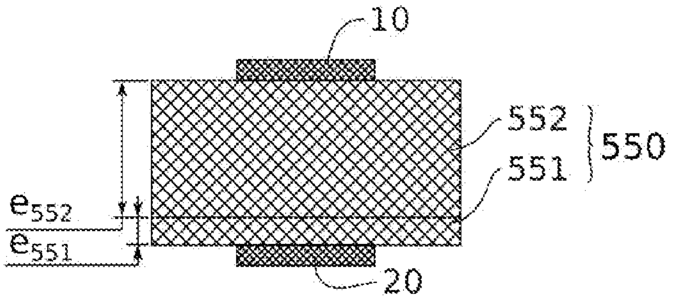
FIG. 7 illustrates an example of a vertical component which can be formed from the platelet of FIG. 6 and by implementing the method according to the invention.

FIG. 7 illustrates another component structure which can be obtained by implementing the method according to the invention. This structure is preferably produced from a platelet 550 as that illustrated in FIG. 6.

The platelet 550 of FIG. 6 can be obtained by implementing the method described above in reference to FIGS. 2A to 2F. This platelet 550 comprises the layers **550*i*, 551, 552 described above. As mentioned above, it is possible to obtain a platelet with no initial layer 550*i***.

FIG. 7 illustrates a diode, for example of the Schottky type. This vertical component comprises:

- an electrode, for example an anode, for example, acting as a source 10 disposed on the face 550A of the layer made of III-N material formed by the second layer 552,
- an electrode, for example a cathode, for example, acting as a drain 20 disposed on the face 550B defined by the first layer 551 made of III-N material.

According to a non-limiting example, the layers 551, 552 have the features, in terms of thickness and/or doping level, mentioned above about the embodiment illustrated in FIGS. 5A to 5D.

Figure 8:
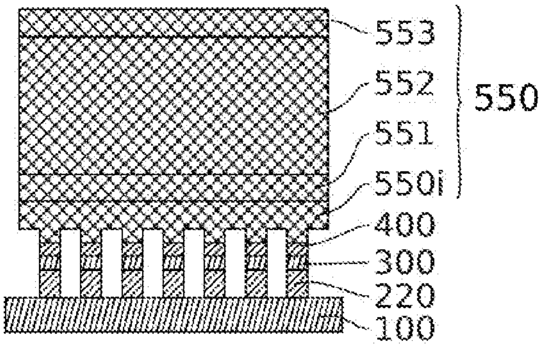
FIG. 8 illustrates another example of a platelet intended to form vertical components.
Figure 9:
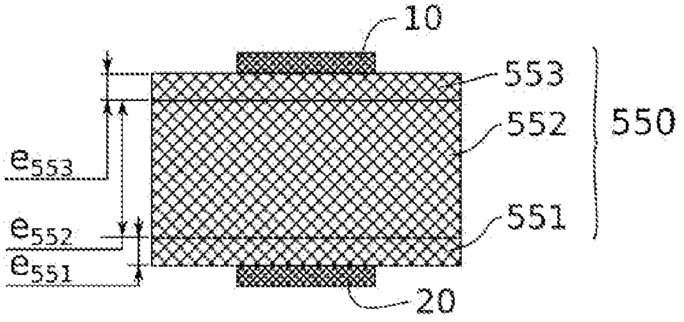
FIG. 9 illustrates an example of a vertical component which can be formed from the platelet of FIG. 8 and by implementing the method according to the invention.

FIG. 9 illustrates another component structure which can be obtained by implementing the method according to the invention. This structure is preferably produced from a platelet 550 like that illustrated in FIG. 8.

The platelet 550 of FIG. 8 can be obtained by implementing the method described above in reference to FIGS. 2A to 2F. This platelet 550 comprises the layers **550*i*, 551, 552, 553 described above. As mentioned above, it is possible to obtain a platelet with no initial layer 550*i***.

FIG. 9 illustrates a diode, for example of the p-i-n type. This vertical component comprises:

- an anode, for example a source 10, disposed on the face 550A of the layer made of III-N material formed by the third layer 553,
- a cathode, for example a drain 20, disposed on the face 550B defined by the first layer 551 made of III-N material.

According to a non-limiting example, the layers 551, 552, 553 have the features, in terms of thickness and/or doping level, mentioned about the embodiment illustrated in FIGS. 5A to 5D.

Example of an Embodiment Illustrated in FIGS. 10A to 10G

In reference to FIGS. 10A to 10G, another example of an embodiment of a vertical component will be described in detail.

Figure 10A:
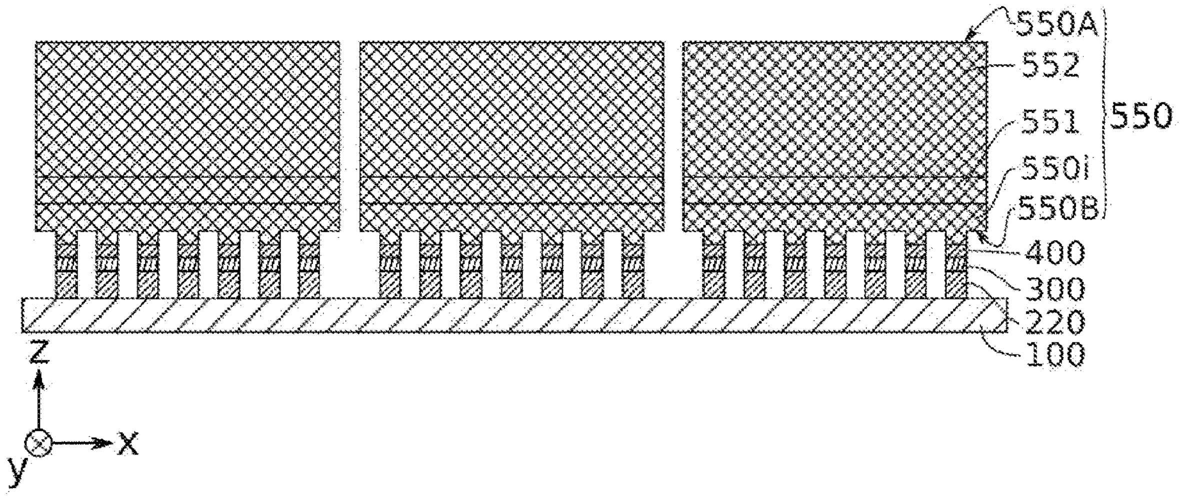
FIGS. 10A to 10G illustrate steps which could be implemented in the scope of the method according to the present invention to obtain an example of a vertical component. The steps of FIGS. 10A to 10G can be implemented from platelets such as that illustrated in FIG. 6, for example.

As illustrated in FIG. 10A, a first step consists of providing a stack comprising platelets 550 each supported by a pad assembly integral with the base substrate 100.

In this example, each platelet corresponds to the platelet 550 illustrated in FIG. 6. However, the example below fully suits the use of different platelets, in particular those illustrated in FIG. 4, 5C or 8.

Figure 10B:
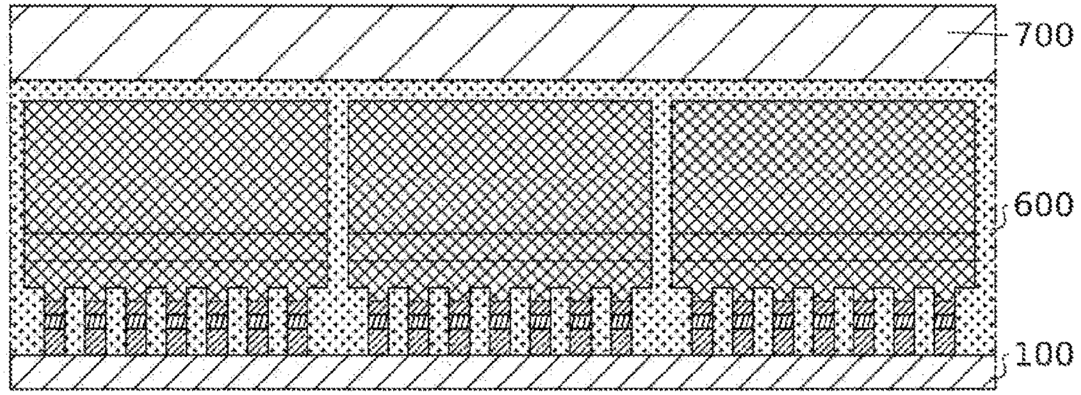

First steps comprise the encapsulation of platelets in an encapsulation layer 600 and the fixing of a sacrificial substrate 700. These steps, the result of which is illustrated in FIG. 10B, correspond to those described above in reference to FIGS. 3A and 3B.

Figure 10C:
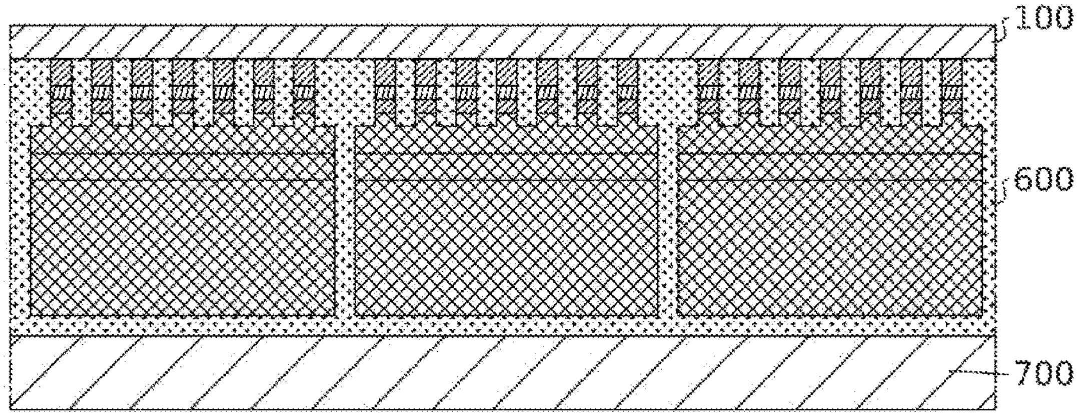

The stack is then returned as illustrated in FIG. 10C.

Figure 10D:
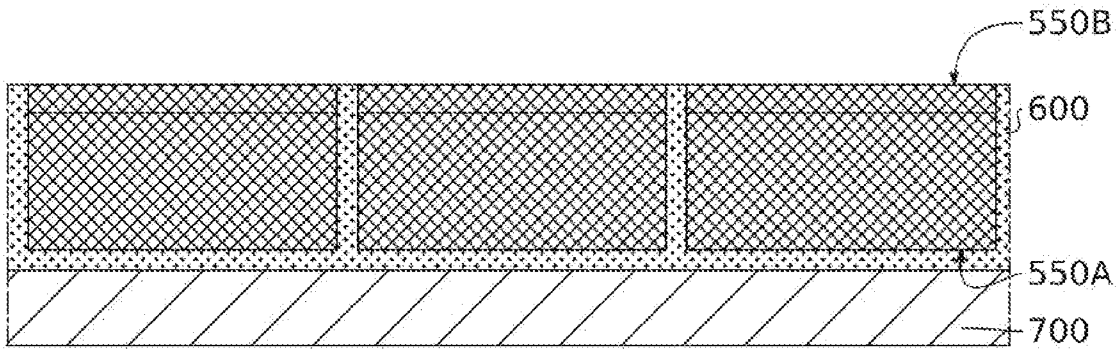
Figure 10E:
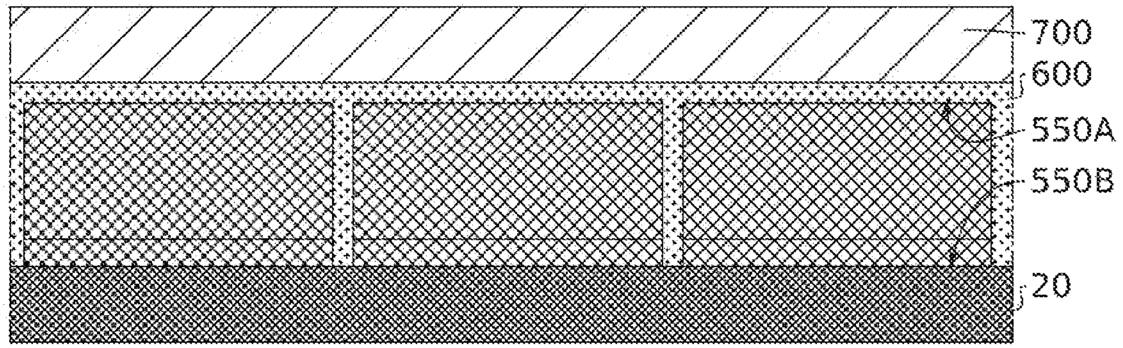
Figure 10F:
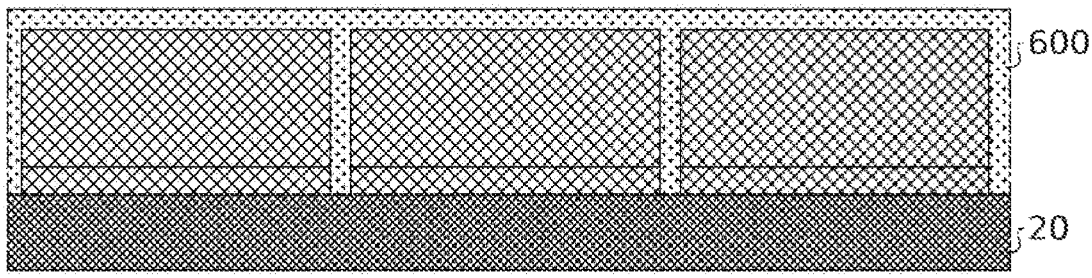
Figure 10G:
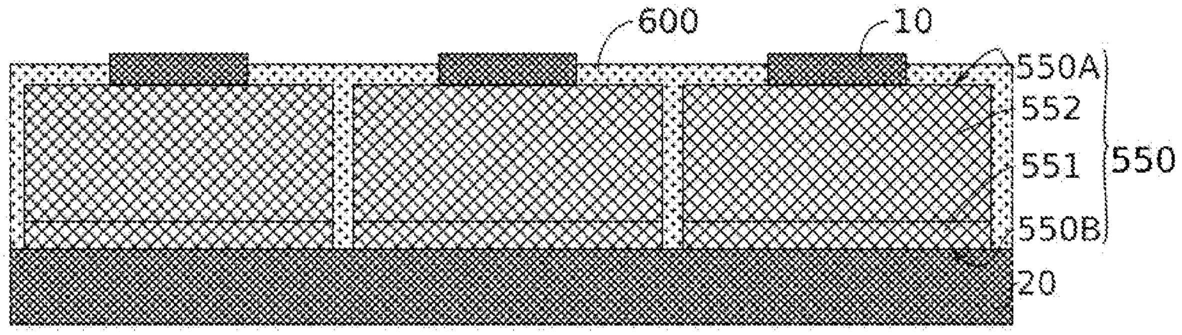

The pads are then removed and the rear face 550B of the layer made of III-N material is stripped, as illustrated in FIG. 10D. For this, the steps described above in reference to FIGS. 3D1 to 3E can be proceeded with.

The second electrode 20 is then formed. For this, a conductive base 20 can, for example, be mounted on the rear face 550B. This step corresponds to that described above in reference to FIG. 3F.

The first electrode 10 is then formed. For this, for example, the encapsulation layer 600 can be opened, to make the front face 550A of the layer of III-N material accessible. This step corresponds to that described above in reference to FIG. 3G. It will be noted that it is possible to produce the first electrode 10 before the second electrode 20.

Example of an Embodiment Illustrated in FIGS. 11A to 11D

In reference to FIGS. 11A to 11D, another example of an embodiment of a vertical component will be described in detail.

Figure 11A:
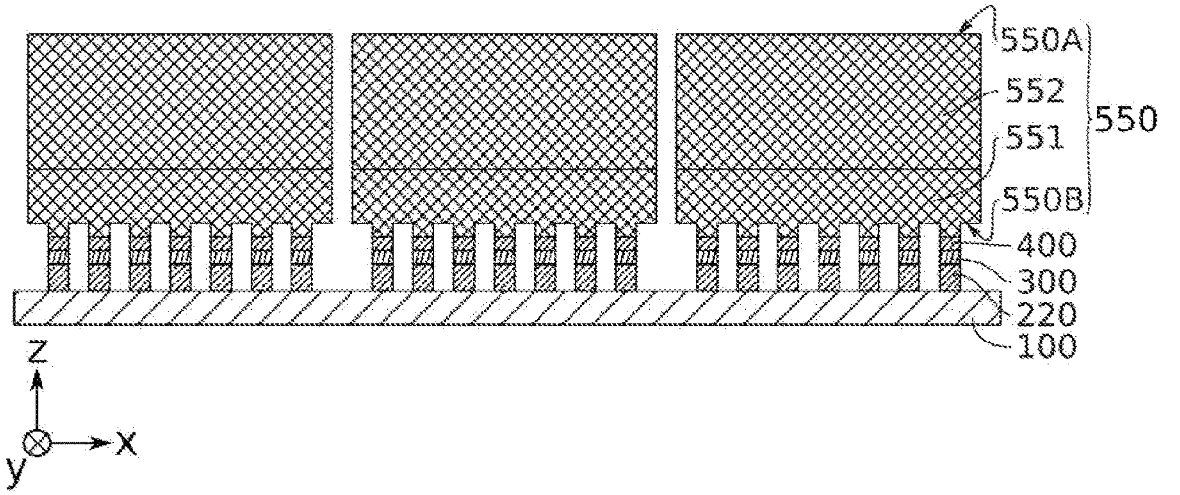
FIGS. 11A to 11D illustrate steps which could implemented in the scope of the method according to the present invention to obtain an example of a vertical component.

As illustrated in FIG. 11A, a first step consists of providing a stack comprising platelets 550, each supported by a pad assembly integral with the base substrate 100.

In this example, each platelet has the layers 551 and 552. Thus, in this example, the initial layer 550*i* produced by coalescence of the crystallites at the top of the pads, is directly the first functional layer 551. Naturally, the example below fully suits the use of different platelets, in particular, any one of the platelets illustrated in FIG. 4, 5C, 6 or 8.

A first step comprises the encapsulation of the platelets 550 in an encapsulation layer 600.

Figure 11B:
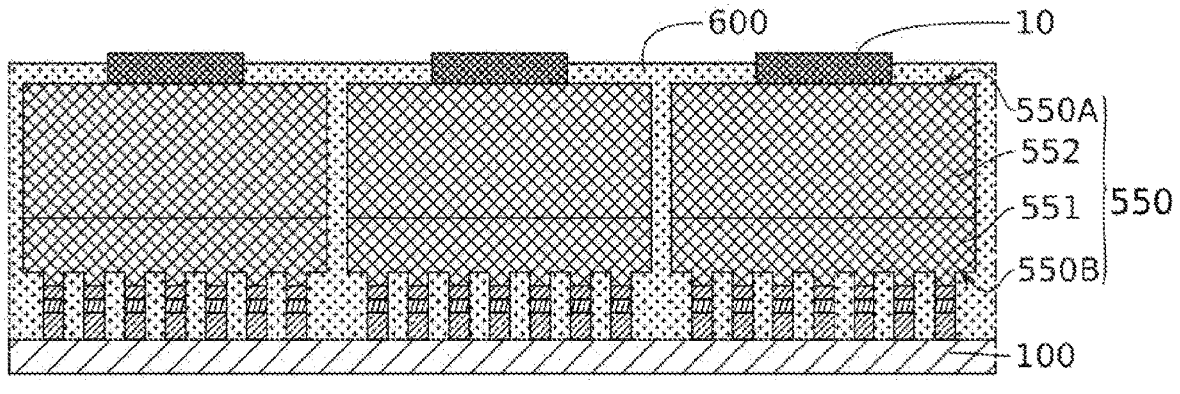

The first electrode 10 is then formed. For this, for example, the encapsulation layer 600 can be opened, to make the front face 550A of the layer of III-N material accessible. The result of this step is illustrated in FIG. 11B.

Figure 11C:
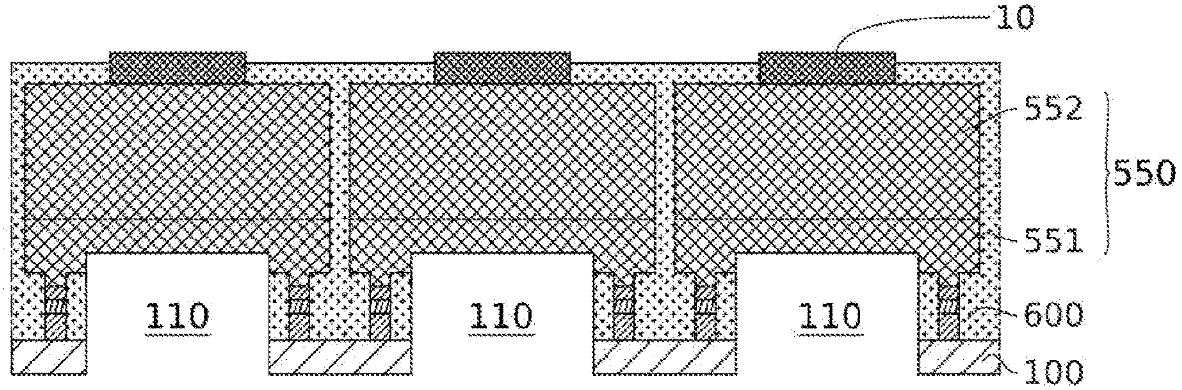

Before or after the formation of the first electrode 10, an opening 110 is produced, through the base substrate 100 and so as to make the first layer 551 of each platelet 550 accessible. This opening 110 can be produced by etching through a mask. During this etching, it can be provided to remove the pads which are located at the right of the opening 10. This step is illustrated in FIG. 11C.

Figure 11D:
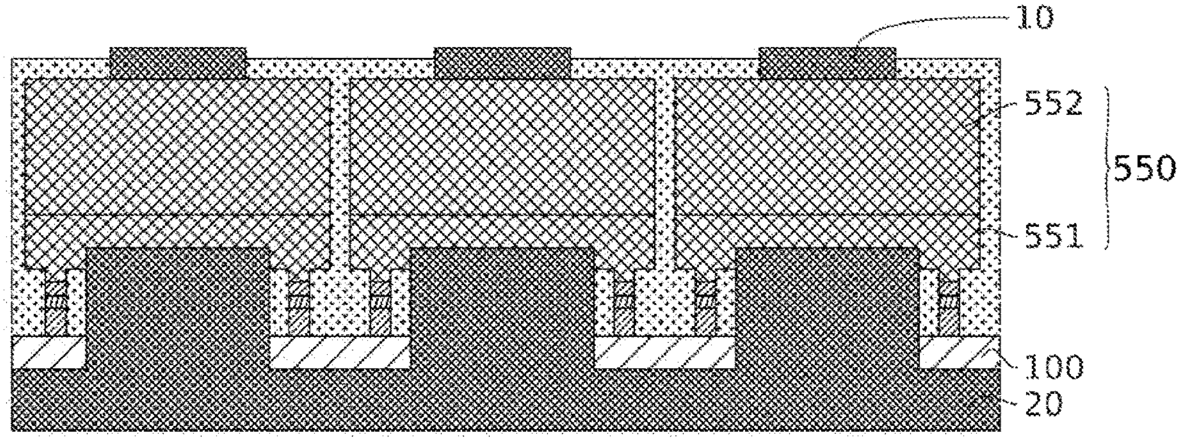

As illustrated in FIG. 11D, the opening 110 is filled with an electrically conductive material, thus defining the second electrode 20. In this example, this electrode 20 can be qualified as TSV (through silicon via). Preferably, the opening 110 is fully filled. The deposition of electrically conductive material preferably forms a layer having a continuous lower face serving as a base to the stack.

It will be noted that, according to an alternative embodiment, the opening 110, as well as the second electrode 20 can be produced before the formation of the first electrode 10.

Moreover, it will be noted that the encapsulation layer 600 is only optional. This embodiment can be implemented with a via opening onto the first layer 551 without necessarily providing an encapsulation layer 600.

This embodiment has the advantage of considerably reducing the number of steps. In particular, it is not necessary to perform steps intended to remove the pads. This embodiment is also interesting to ensure a thermal conductivity between the platelet and the substrate.

Thus, in the embodiments of FIGS. 5A to 11D, one from among the first 10 and the second 20 electrodes is located on the first face 550A of the platelet 550 and the other from among the first 10 and the second 20 electrodes is located on the second face 550B of the platelet 550. This enables that the current passing from one electrode to the other passes through the whole thickness of the first and second layers, which considerably improves the performance of the device.

Example of an Embodiment Illustrated in FIGS. 12A to 12E

In reference to FIGS. 12A to 12E, another example of an embodiment of a vertical component will be described in detail.

Figure 12A:
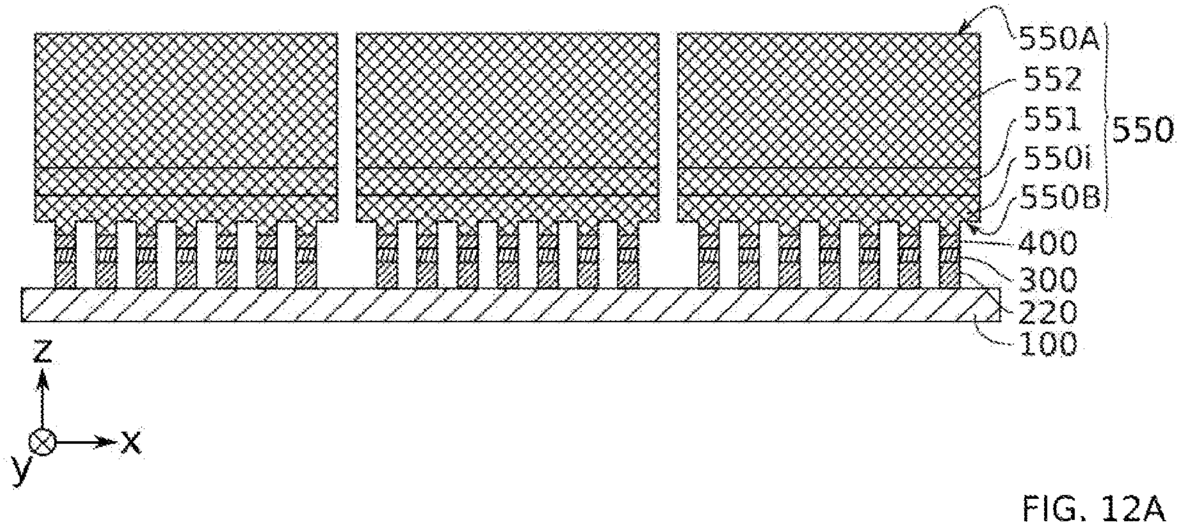
FIGS. 12A to 12E illustrate steps which could be implemented in the scope of the method according to the present invention to obtain an example of a vertical component. The steps of FIGS. 12A to 12E can be implemented from platelets such as that illustrated in FIG. 6, for example.

As illustrated in FIG. 12A, a first step consists of providing a stack comprising platelets 550 each supported by a pad assembly integral with the base substrate 100.

In this example, each platelet has the layers 550*i*, 551 and 552. Naturally, the example below fully suits the use of different platelets, in particular any one of the platelets illustrated in FIG. 4, 5C, 6 or 8 or 11A.

Figure 12B:
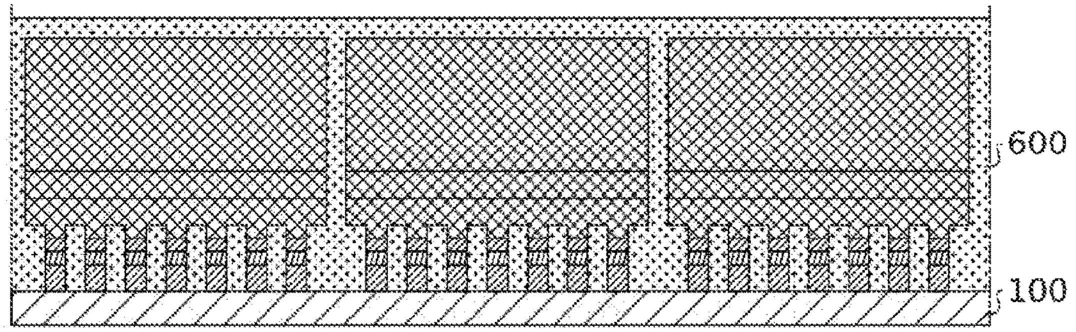

A first step comprises the encapsulation of the platelets 550 in an encapsulation layer 600. This step is illustrated in FIG. 12B.

The first electrode 10 is then formed. For this, for example, the encapsulation layer 600 can be opened to make the front face 550A of the layer of III-N material accessible.

Figure 12C:
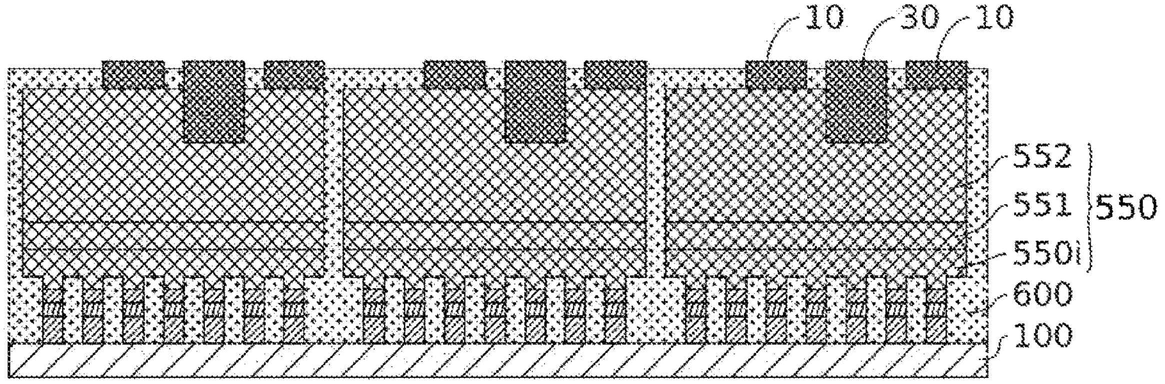

Before or after, or preferably simultaneously to the formation of the first electrode 10, an electrode serving as a gate 30 can be produced, if the vertical component is a transistor. As illustrated in the figures, preferably, it is provided that the first electrode 10 surrounds the gate 30. Thus, the first electrode can, for example, form on the front face 550A, a ring surrounding the gate 30. For the production of at least one gate 30, a prior etching can be provided within the second layer 552 such that the gate 30 penetrates at least partially into this second layer 552. The result of this step is illustrated in FIG. 12C.

Before or after the production of the first electrode 10 and the gate 30, the second electrode 20 is produced.

Figure 12D:
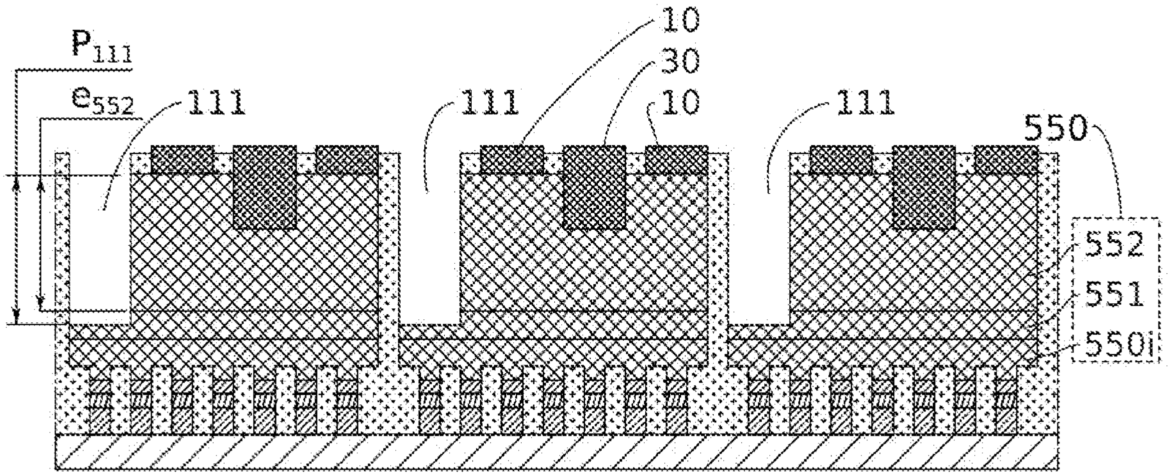
Figure 12E:
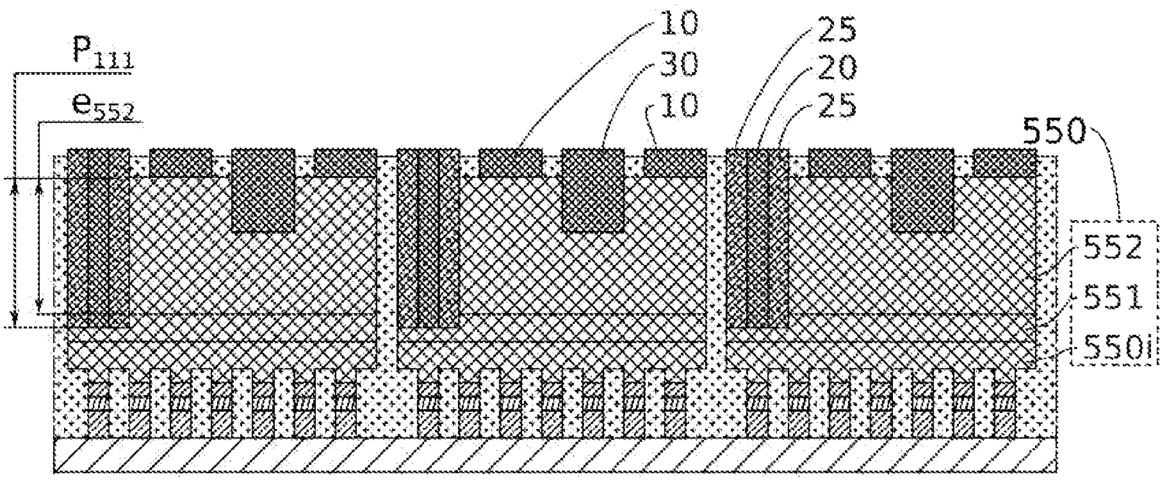

For this, a first step consists of producing a hole also called via 111, from the front face 550A of the platelet 550. This via 111 extends into the layer made of III-N material over a depth p111. p111 is considered so as to make the first layer 551 accessible. Thus, p111 is greater than the distance separating the front face 550A of the first layer 551. In this example, this distance corresponds to the thickness $e_{552}$ of the second layer 552. This step is illustrated in FIG. 12D.

An electrically conductive material is then deposited inside the via 111 to produce the second electrode 20 forming an electrical contact with the first layer 551. Naturally, beforehand, the walls of the via 11 will have been electrically insulated, to avoid any electrical conduction between the second electrode 20 and the layers of III-N materials surmounting the first layer 551. In this non-limiting example, only the second layer 552 surmounts the first layer 551. The electrical insulation layer(s) of the via 111 are referenced 25 in FIG. 12E.

In this non-limiting example, the vertical component is a transistor, the first electrode 10 and the second electrode 20 thus effectively forming the drain is the source.

This vertical component structure, with a through electrode, as well as the production method, are fully applicable to vertical components, other than transistors. To produce a diode, for example, the same steps can be proceeded with, the steps of producing the gate thus being naturally removed.

This embodiment has the advantage of considerably reducing the number of steps. In particular, it is not necessary to perform steps intended to remove the pads. Moreover, it enables the contacts with the first 10 and second electrodes 20 from the same face of the component.

Example of an Embodiment Illustrated in FIGS. 13A to 13G

In reference to FIGS. 13A to 13G, another example of an embodiment of a vertical component will be described in detail.

Figure 13A:
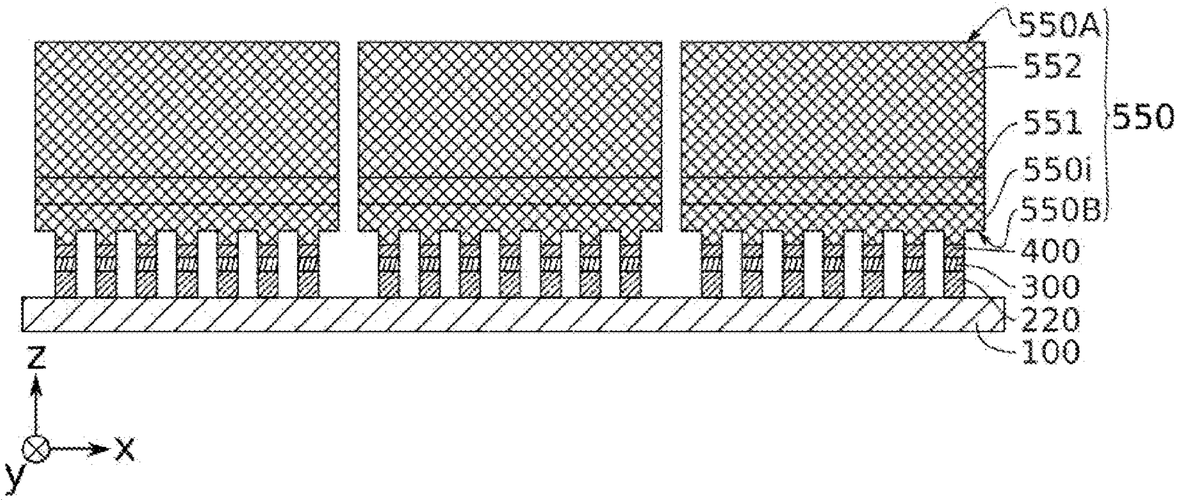
FIGS. 13A to 13G illustrate steps which could be implemented in the scope of the method according to the present invention to obtain an example of a vertical component. The steps of FIGS. 13A to 13G can be implemented from platelets such as that illustrated in FIG. 6, for example.

The step illustrated in FIG. 13A corresponds to that described above in reference to FIG. 10A.

Figure 13B:
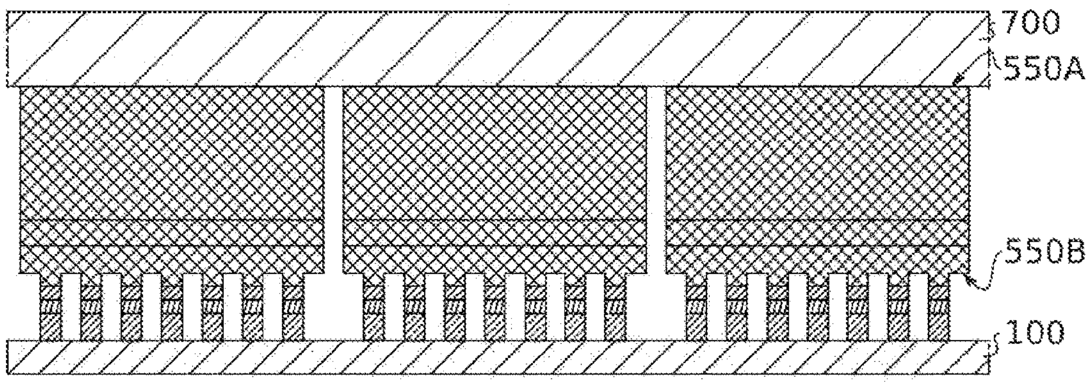

A sacrificial substrate 700 is then mounted on the front face 550A of the platelet 550. This step, illustrated in FIG. 13B, is therefore close to that illustrated in FIG. 10B, with the difference that this sacrificial substrate 700 is mounted directly on the platelets 550 and that there is no encapsulation layer 600.

Figure 13C:
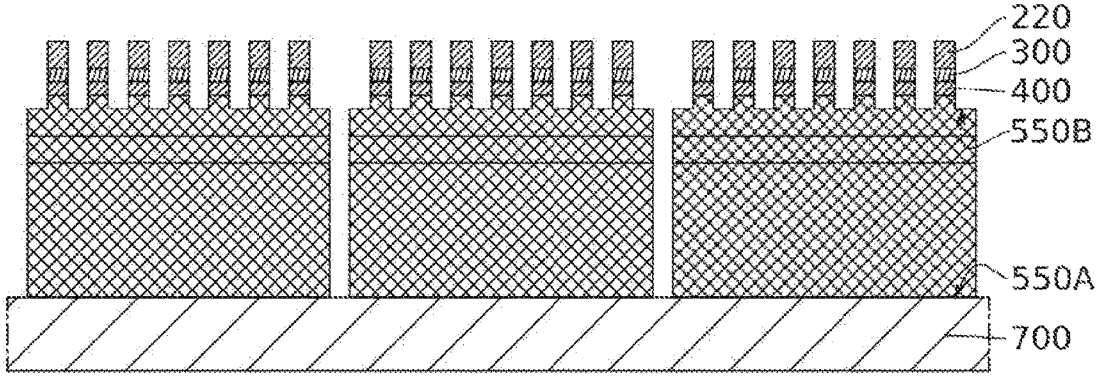

The stack is then returned. The base substrate 100 is removed. This removal can be carried out mechanically. During this removal, most of the pads are broken, in particular at their creeping portion 220. This step is illustrated in FIG. 13C.

Figure 13D:
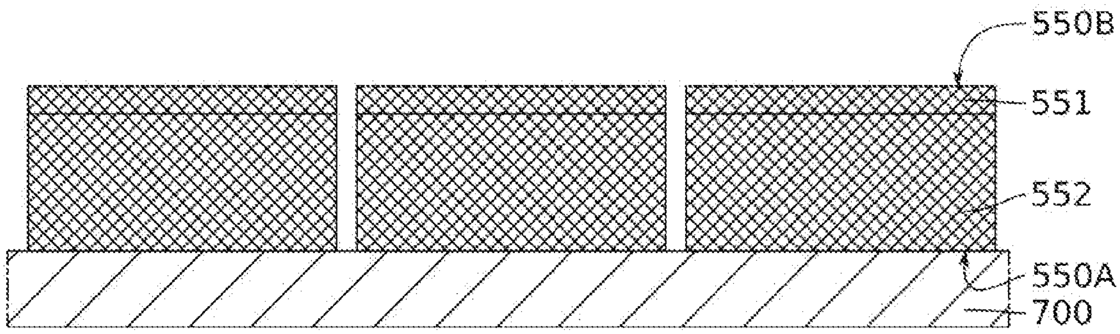
Figure 13E:
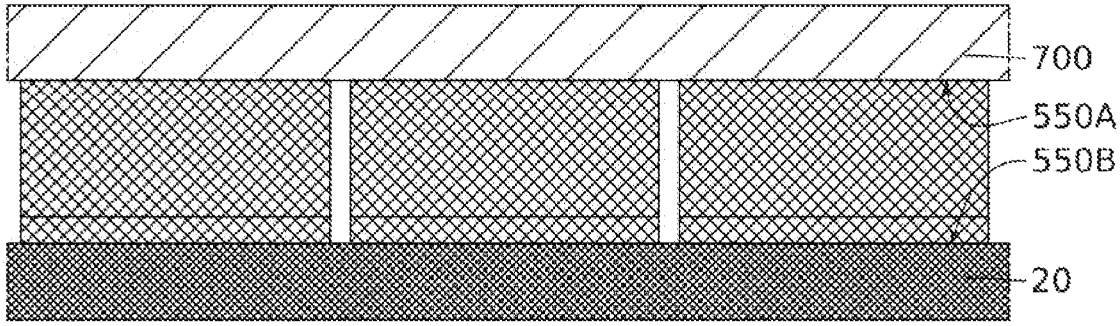

As illustrated in FIG. 13D, the first layer 551 of the III-N material is made accessible. For this, the remaining portions of the pads are removed. The optional initial layer 550*i* is also removed.

Figure 13F:
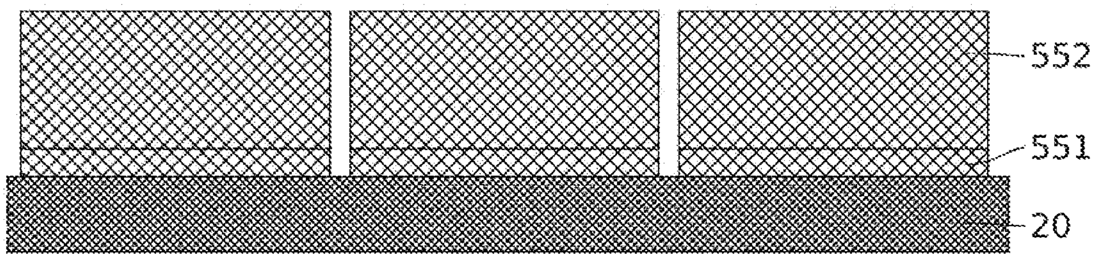

The electrode 20 is then disposed in contact with the first layer 551. For this, the platelets 550 are preferably fixed to an electrically conductive substrate, as illustrated in FIG. 13F.

Figure 13G:
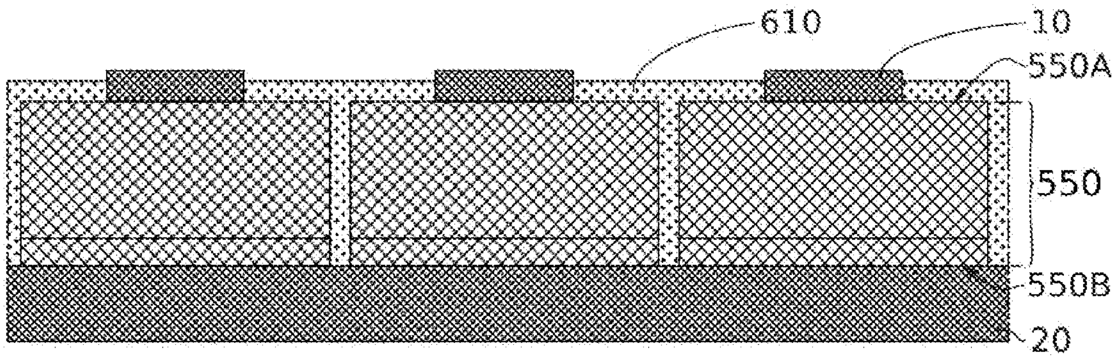

The FIG. 13G illustrate the result of the following steps. These steps comprise the formation of the first electrode 10 on the front face 550A, the platelets 550 and the formation of a passivation layer 610 to electrically insulate the platelet 550.

With respect to the embodiments of FIGS. 10A to 10G, this embodiment has the advantage of reducing the number of steps by avoiding the formation of the encapsulation layer 600.

In view of the description above, it appears clearly that the present invention proposes a particularly effective solution for obtaining vertical microelectronic components with the basis of a III-N material having a great purity, a low density of dislocations and a high thickness, typically a thickness greater than 8 μm.

Thus, the invention is particularly advantageous for the production of GaN diode and transistor power components, for the market of plateletrete components over ranges of a few 100V to a few kV in a range of intensity typically comprised in the range of 1 Ampere (A) to a few hundred Amperes. Other applications can naturally be considered.

The invention is not limited to the embodiments described above.

In particular, the examples above describe certain examples of layers of III-N material formed of several sublayers having different dopings. The method according to the invention is not limited to a certain number of doped layers, to certain types of doping or also to certain combinations of doped layers.

Moreover, in all the examples described above, the first electrode 10 can be produced before or after the second electrode 20.

The invention claimed is:

1. A method for producing a vertical microelectronic component comprising at least one layer with a basis of a III-N material, the method comprising:

providing a stack comprising a plurality of pads extending from a base substrate, the pads being distributed over the base substrate so as to form several pad assemblies, at least some of the pads of the assembly comprising at least: one top to form a germination layer, one crystalline section, and one creeping section, formed of a material having a vitreous transition temperature, the crystalline section surmounting the creeping section, epitaxially growing a crystallite made of the III-N material on at least some of tops of said pads and continuing the epitaxial growth of the crystallites until coalescence of the crystallites carried by adjacent pads of one same assembly, so as to form on each assembly, a platelet made of the III-N material, and interrupting the epitaxial growth of the crystallites before those crystallites belonging to two distinct pad assemblies coalesce, such that the platelets of each pad assembly are distant from one another, wherein the method further comprises doping the III-N material of the platelets such that at least some of the platelets comprise at least: one first layer with the basis of the III-N material and which has a first doping taken from among the n+, n− and p doping types, and one second layer with the basis of the III-N material and which has a second doping taken from among the n+, n− and p doping types, the types of the first and second dopings being different, the first and second layers are stacked in the platelet, in a vertical direction, between a first face and a second face of the platelet, the method further comprises producing a first electrode and a second electrode located on the platelet and configured such that a current passing from one electrode to the other passes through at least the second layer in a whole thickness, the thickness being taken in said vertical direction, wherein the method further comprises, after the production of the platelet on each pad assembly, fixing a handling substrate on the stack such that the platelets and the pads are located between the base substrate and the handling substrate, removing the base substrate, making the second face of the platelets accessible, which comprises removing the pads, and forming the second electrode on the second face, the second electrode being a conductive substrate mounted on the second face, and wherein the method further comprises removing the handling substrate after forming the second electrode on the second face.

2. The method according to claim 1, wherein the electrodes are configured such that a current passing from one electrode to the other also passes through the first layer in all of a thickness of the first layer, the first and second layers being located between the first electrode and the second electrode.

3. The method according to claim 2, wherein one from among the first electrode and the second electrode is located on the first face of the platelet and the other from among the first electrode and the second electrode is located on the second face of the platelet.

4. The method according to claim 1, wherein one from among the first and the second electrodes is located on the first face of one of the platelets and the other from among the first and the second electrodes extends, in the vertical direction, from the first face and to the first layer by passing through the second layer.

5. The method according to claim 1, wherein said platelets only comprise said first layer and said second layer.

6. The method according to claim 1, wherein said platelets comprise said first layer, said second layer, and a third layer surmounting the second layer and having a p type doping, positioned such that the second layer is located between the first and third layers, the component forming a p-i-n type diode or a transistor.

7. The method according to claim 6, wherein the platelets only comprise said first layer, said second layer, and said third layer, the vertical microelectronic component forming a p-i-n type diode.

8. The method according to claim 6, wherein the platelets comprise said first layer, said second layer, said third layer, as well as at least one fourth layer surmounting the third layer and having an n+ type doping, the vertical microelectronic component forming a transistor.

9. The method according to claim 8, wherein:
during growth of the third layer, a first lateral portion epitaxially grows on flanks of the second layer,
during growth of the fourth layer, a second lateral portion epitaxially grows on the flanks of the second layer and on the first lateral portion, and
the growth and the doping level of the third layer and of the fourth layer is controlled such that the first and second lateral portions form an electrically insulating barrier.

10. The method according to claim 1, wherein the step of removing the pads is performed before the production of the first electrode and before the production of the second electrode.

11. The method according to claim 1, wherein the step of removing the pads is performed after the production of the first electrode and before the production of the second electrode.

12. The method according to claim 1, wherein the pads are preserved after the production of the first electrode and after the production of the second electrode.

13. The method according to claim 1, wherein the method further comprises making at least a portion of the first face of the platelets accessible, and forming the first electrode on the first face.

14. The method according to claim 13, wherein the method comprises, after the removal of the pads, producing an encapsulation layer encapsulating the platelets and covering the first face, the first electrode being formed through the encapsulation layer.

15. The method according to claim 13, wherein the making at least a portion of the first face of the platelets accessible comprises fully stripping the first face of the platelets.

16. The method according to claim 13, wherein the first electrode is formed so as to not cover a central zone of the first face intended to receive an electrode forming a transistor gate, and to extend over a peripheral zone surrounding the central zone.

17. The method according to claim 1, wherein the method further comprises, before the fixing of the handling substrate, producing an encapsulation layer encapsulating the platelets and covering the first face.

18. A method for producing a vertical microelectronic component comprising at least one layer with a basis of a III-N material, the method comprising:
providing a stack comprising a plurality of pads extending from a base substrate, the pads being distributed over the base substrate so as to form several pad assemblies, at least some of the pads of the assembly comprising at least: one top to form a germination layer, one crystalline section, and one creeping section, formed of a material having a vitreous transition temperature, the crystalline section surmounting the creeping section,
epitaxially growing a crystallite made of the III-N material on at least some of tops of said pads and continuing the epitaxial growth of the crystallites until coalescence of the crystallites carried by adjacent pads of one same assembly, so as to form on each assembly, a platelet made of the III-N material, and
interrupting the epitaxial growth of the crystallites before those crystallites belonging to two distinct pad assemblies coalesce, such that the platelets of each pad assembly are distant from one another, wherein
the method further comprises doping the III-N material of the platelets such that at least some of the platelets comprise at least: one first layer with the basis of the III-N material and which has a first doping taken from among the n+, n− and p doping types, and one second layer with the basis of the III-N material and which has a second doping taken from among the n+, n− and p doping types, the types of the first and second dopings being different,
the first and second layers are stacked in the platelet, in a vertical direction, between a first face and a second face of the platelet,
the method further comprises producing a first electrode and a second electrode located on the platelet and configured such that a current passing from one electrode to the other passes through at least the second layer in a whole thickness, the thickness being taken in said vertical direction, and
wherein the method further comprises, after the production of the platelet on each pad assembly:
producing at least one opening for each platelet through the base substrate and the pads so as to make at least some of the second face of the platelets accessible, by preserving certain pads,
forming the second electrode on the second face, by filling said opening by an electrically conductive material, and
before or after the production of the at least one opening, forming the first electrode on the first face.

19. A method for producing a vertical microelectronic component comprising at least one layer with a basis of a III-N material, the method comprising:
providing a stack comprising a plurality of pads extending from a base substrate, the pads being distributed over the base substrate so as to form several pad assemblies, at least some of the pads of the assembly comprising at least: one top to form a germination layer, one crystalline section, and one creeping section, formed of a material having a vitreous transition temperature, the crystalline section surmounting the creeping section,
epitaxially growing a crystallite made of the III-N material on at least some of tops of said pads and continuing the epitaxial growth of the crystallites until coalescence of the crystallites carried by adjacent pads of one same assembly, so as to form on each assembly, a platelet made of the III-N material, and
interrupting the epitaxial growth of the crystallites before those crystallites belonging to two distinct pad assemblies coalesce, such that the platelets of each pad assembly are distant from one another, wherein
the method further comprises doping the III-N material of the platelets such that at least some of the platelets comprise at least: one first layer with the basis of the III-N material and which has a first doping taken from among the n+, n− and p doping types, and one second layer with the basis of the III-N material and which has a second doping taken from among the n+, n− and p doping types, the types of the first and second dopings being different,
the first and second layers are stacked in the platelet, in a vertical direction, between a first face and a second face of the platelet,
the method further comprises producing a first electrode and a second electrode located on the platelet and configured such that a current passing from one electrode to the other passes through at least the second layer in a whole thickness, the thickness being taken in said vertical direction, and wherein the method further comprises, after the production of the platelet on each pad assembly:

producing at least one hole for each platelet, the hole extending from the first face and at least to the first layer, forming the second electrode by filling the hole with at least one electrical insulating layer and with an electrically conductive material, the at least one electrical insulating layer preventing any electrical conduction between the second electrode and the second layer, and forming the first electrode on the first face.

* * * * *